(12) United States Patent
Yeon et al.

(10) Patent No.: US 12,224,305 B2
(45) Date of Patent: Feb. 11, 2025

(54) LED DISPLAY APPARATUS INCLUDING PARTITION AND GAP-FILL LAYER

(71) Applicant: SAMSUNG ELECTRONICS CO., LTD., Suwon-si (KR)

(72) Inventors: Jihye Yeon, Hwaseong-si (KR); Hankyu Seong, Seoul (KR); Sunghyun Sim, Uiwang-si (KR); Junbu Youn, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 407 days.

(21) Appl. No.: 17/162,590

(22) Filed: Jan. 29, 2021

(65) Prior Publication Data

US 2021/0366981 A1 Nov. 25, 2021

(30) Foreign Application Priority Data

May 21, 2020 (KR) .................. 10-2020-0061000

(51) Int. Cl.
*H10K 59/122* (2023.01)
*H01L 27/15* (2006.01)
(Continued)

(52) U.S. Cl.
CPC .......... *H01L 27/156* (2013.01); *H01L 33/382* (2013.01); *H01L 33/502* (2013.01);
(Continued)

(58) Field of Classification Search
CPC ......... H10K 59/35–353; H10K 50/865; H10K 59/122; H10K 50/8428; H10K 59/12;
(Continued)

(56) References Cited

U.S. PATENT DOCUMENTS 6,372,608 B1 4/2002 Shimoda et al.
6,645,830 B2 11/2003 Shimoda et al.
(Continued)

FOREIGN PATENT DOCUMENTS

KR 10-2016-0023158 A 3/2016
KR 10-2017-0142022 A 12/2017
(Continued)

OTHER PUBLICATIONS

Communication issued Oct. 29, 2024 by the Korean Intellectual Property Office in Korean Patent Application No. 10-2020-0061000.

*Primary Examiner* — David Chen
(74) *Attorney, Agent, or Firm* — Sughrue Mion, PLLC

(57) ABSTRACT

A display device includes a circuit substrate including a driving circuit; an LED cell array disposed on the circuit substrate, and including a plurality of LED modules, each of the plurality of LED modules including at least two LED cells, from among a plurality of LED cells of the LED cell array, and an insulator coupling the at least two LED cells to each other; a gap-fill layer filling a gap between the plurality of LED modules; a partition disposed on the LED cell array, and defining a plurality of light emitting windows disposed in regions corresponding to the plurality of LED cells, respectively; and at least one color conversion layer disposed in at least a portion of the plurality of light emitting windows.

18 Claims, 32 Drawing Sheets

(51) Int. Cl.
*H01L 33/38* (2010.01)
*H01L 33/50* (2010.01)
*H01L 33/60* (2010.01)
*H01L 33/62* (2010.01)
*H10K 59/35* (2023.01)

(52) U.S. Cl.
CPC .............. *H01L 33/60* (2013.01); *H01L 33/62* (2013.01); *H10K 59/122* (2023.02); *H10K 59/35* (2023.02)

(58) Field of Classification Search
CPC ....... H01L 27/156; H01L 33/60; H01L 33/62; H01L 33/382; H01L 33/504; H01L 33/502
USPC ............ 257/40, 59, 432, 51.018; 438/27, 34
See application file for complete search history.

(56) References Cited

U.S. PATENT DOCUMENTS

| | | | |
|---|---|---|---|
| RE38,466 E | 3/2004 | Inoue et al. | |
| 6,818,465 B2 | 11/2004 | Biwa et al. | |
| 6,818,530 B2 | 11/2004 | Shimoda et al. | |
| 6,858,081 B2 | 2/2005 | Biwa et al. | |
| 6,967,353 B2 | 11/2005 | Suzuki et al. | |
| 7,002,182 B2 | 2/2006 | Okuyama et al. | |
| 7,084,420 B2 | 8/2006 | Kim et al. | |
| 7,087,932 B2 | 8/2006 | Okuyama et al. | |
| 7,154,124 B2 | 12/2006 | Han et al. | |
| 7,208,725 B2 | 4/2007 | Sherrer et al. | |
| 7,288,758 B2 | 10/2007 | Sherrer et al. | |
| 7,319,044 B2 | 1/2008 | Han et al. | |
| 7,501,656 B2 | 3/2009 | Han et al. | |
| 7,709,857 B2 | 5/2010 | Kim et al. | |
| 7,759,140 B2 | 7/2010 | Lee et al. | |
| 7,781,727 B2 | 8/2010 | Sherrer et al. | |
| 7,790,482 B2 | 9/2010 | Han et al. | |
| 7,940,350 B2 | 5/2011 | Jeong | |
| 7,959,312 B2 | 6/2011 | Yoo et al. | |
| 7,964,881 B2 | 6/2011 | Choi et al. | |
| 7,985,976 B2 | 7/2011 | Choi et al. | |
| 7,994,525 B2 | 8/2011 | Lee et al. | |
| 8,008,683 B2 | 8/2011 | Choi et al. | |
| 8,013,352 B2 | 9/2011 | Lee et al. | |
| 8,049,161 B2 | 11/2011 | Sherrer et al. | |
| 8,129,711 B2 | 3/2012 | Kang et al. | |
| 8,179,938 B2 | 5/2012 | Kim | |
| 8,263,987 B2 | 9/2012 | Choi et al. | |
| 8,324,646 B2 | 12/2012 | Lee et al. | |
| 8,399,944 B2 | 3/2013 | Kwak et al. | |
| 8,432,511 B2 | 4/2013 | Jeong | |
| 8,459,832 B2 | 6/2013 | Kim | |
| 8,502,242 B2 | 8/2013 | Kim | |
| 8,536,604 B2 | 9/2013 | Kwak et al. | |
| 8,735,931 B2 | 5/2014 | Han et al. | |
| 8,766,295 B2 | 7/2014 | Kim | |
| 10,438,994 B2 | 10/2019 | Yeon et al. | |
| 2009/0122232 A1* | 5/2009 | Seki | G09G 3/3426 362/97.3 |
| 2015/0362165 A1* | 12/2015 | Chu | H01L 33/32 362/235 |
| 2016/0054173 A1 | 2/2016 | Kim et al. | |
| 2016/0351767 A1* | 12/2016 | Choi | H01L 25/167 |
| 2017/0250316 A1* | 8/2017 | Yeon | H01L 33/504 |
| 2017/0286044 A1* | 10/2017 | Kim | G09G 3/3607 |
| 2017/0294479 A1 | 10/2017 | Cha et al. | |
| 2018/0044588 A1* | 2/2018 | Watanabe | H01L 33/502 |
| 2018/0047780 A1* | 2/2018 | Yeon | H01L 33/504 |
| 2018/0166424 A1* | 6/2018 | Sim | H01L 33/483 |
| 2018/0308420 A1 | 10/2018 | Shin et al. | |
| 2019/0025634 A1* | 1/2019 | Park | G02F 1/133516 |
| 2019/0094616 A1* | 3/2019 | Kim | G02B 6/0051 |
| 2019/0244938 A1 | 8/2019 | Bang et al. | |
| 2019/0267420 A1* | 8/2019 | Lee | H01L 27/14621 |
| 2019/0371779 A1 | 12/2019 | Yeon et al. | |
| 2020/0035768 A1* | 1/2020 | Okabe | H10K 59/122 |
| 2020/0135706 A1* | 4/2020 | Sa | H01L 25/167 |

FOREIGN PATENT DOCUMENTS

| | | |
|---|---|---|
| KR | 10-2018-0053864 A | 5/2018 |
| KR | 10-2018-0078940 A | 7/2018 |
| KR | 10-2019-0118992 A | 10/2019 |
| KR | 10-2019-0130081 A | 11/2019 |
| KR | 10-2019-0137458 A | 12/2019 |

* cited by examiner

LED DISPLAY APPARATUS INCLUDING PARTITION AND GAP-FILL LAYER

CROSS-REFERENCE TO THE RELATED APPLICATION

This application claims benefit of priority to Korean Patent Application No. 10-2020-0061000 filed on May 21, 2020 in the Korean Intellectual Property Office, the disclosure of which is incorporated herein by reference in its entirety.

BACKGROUND

Example embodiments of the present disclosure relate to a display device including a micro-LED.

A semiconductor light emitting diode (LED) has been used as a light source for a lighting device and also as a light source of various electronic products. A semiconductor LED has been widely used, particularly, as a light source for various display devices such as a TV, a mobile phone, a PC, a laptop PC, a PDA, and the like.

A general display device may include a display panel mainly implemented by a liquid crystal display (LCD), and a backlight. Recently, a display device has also been developed to use an LED device as a pixel such that a backlight may not be required. Such a display device may have a compact size, and may be implemented as a high luminance display device having improved luminous efficiency as compared to a general LCD.

SUMMARY

An example embodiment of the present disclosure is to provide an LED display device which may streamline a process of transferring a micro-LED and may reduce the issues caused by alignment tolerance of a pixel (particularly, a sub-pixel).

According to an example embodiment of the present disclosure, a display device includes: a circuit substrate including a driving circuit; an LED cell array disposed on the circuit substrate, and including a plurality of LED modules, each of the plurality of LED modules including at least two LED cells, from among a plurality of LED cells of the LED cell array, and an insulator coupling the at least two LED cells to each other; a gap-fill layer filling a gap between the plurality of LED modules; a partition disposed on the LED cell array, and defining a plurality of light emitting windows disposed in regions corresponding to the plurality of LED cells, respectively; and at least one color conversion layer disposed in at least a portion of the plurality of light emitting windows, wherein each LED cell of the plurality of LED cells includes an active layer, a first conductivity-type semiconductor layer on a first side of the active layer of the LED cell that is towards the partition, and a second conductivity-type semiconductor layer that is on a second side of the active layer of the LED cell that is towards the circuit substrate, and wherein each LED cell of the plurality of LED cells further includes a first electrode and a second electrode that are configured to connect the first conductivity-type semiconductor layer and the second conductivity-type semiconductor layer, respectively, to the driving circuit.

According to an example embodiment of the present disclosure, a display device includes: a circuit substrate; an LED cell array disposed on the circuit substrate, and including a plurality of LED modules that each include a plurality of LED cells, where the plurality of LED cells are provided as a plurality of sub-pixels included in each of a plurality of pixels; a gap-fill layer filling a gap between the plurality of LED modules; a partition disposed on the LED cell array, and defining a plurality of light emitting windows disposed in regions corresponding to the plurality of LED cells, respectively, and distances between adjacent ones of the plurality of light emitting windows are the same as each other; and at least one color conversion layer disposed in at least a portion of the plurality of light emitting windows, wherein a first imaginary vertical line passing through a center of a region between adjacent LED cells from among the plurality of LED cells is offset from a second imaginary vertical line passing through a center of a portion of the partition disposed on the region between the adjacent LED cells, in at least one of the plurality of LED modules.

According to an example embodiment of the present disclosure, a display device includes: a circuit substrate; an LED cell array disposed on the circuit substrate, and including a plurality of LED modules that each include a plurality of LED cells, where the plurality of LED cells are provided as a plurality of sub-pixels included in each of a plurality of pixels; a plurality of partitions disposed on the plurality of LED modules, respectively, each partition from among the plurality of partitions defining a plurality of light emitting windows disposed in regions corresponding to the plurality of LED cells of a respective one of the plurality of LED modules; a gap-fill layer filling a gap that is between the plurality of LED modules and between the plurality of partitions; at least one color conversion layer disposed in at least a portion of the plurality of light emitting windows; and a light blocking pattern disposed on the plurality of partitions, connected to the gap-fill layer, and having a plurality of openings that expose the plurality of light emitting windows, respectively, each of the plurality of openings having a same width.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, embodiments of the present disclosure will be described as follows with reference to the accompanying drawings.

Figure 1:
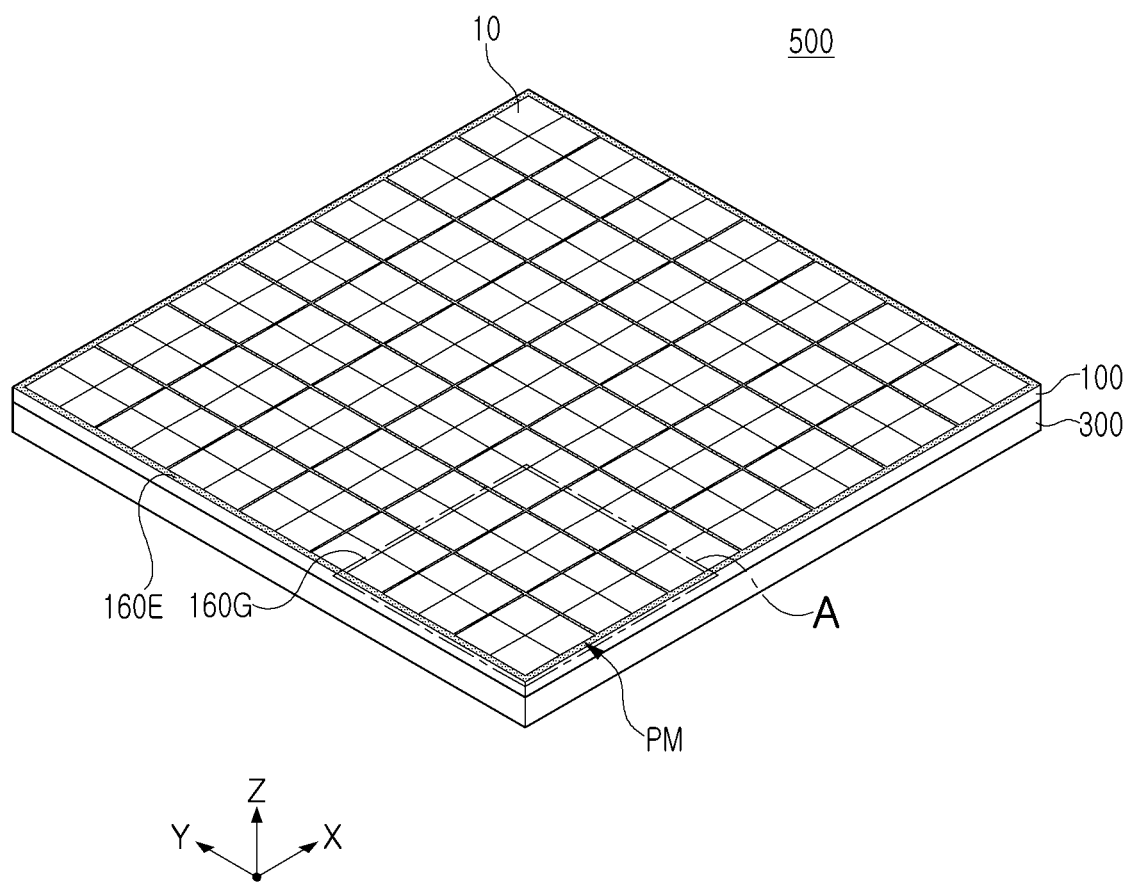
FIG. 1 is a perspective diagram illustrating a display device according to an example embodiment of the present disclosure.
Figure 2:
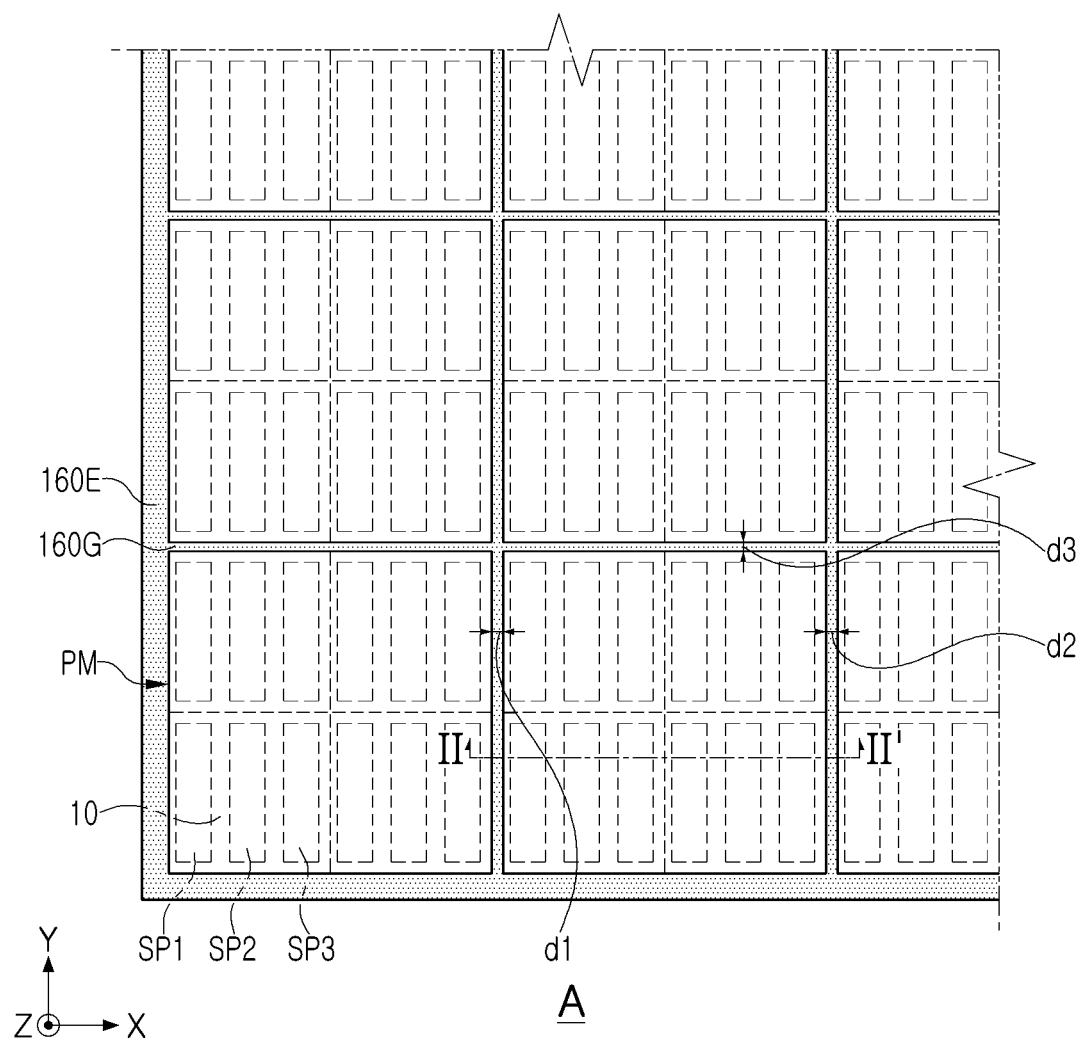
FIG. 2 is a plan diagram illustrating portion "A" of the display device illustrated in FIG. 1.

FIG. 1 is a perspective diagram illustrating a display device according to an example embodiment. FIG. 2 is a plan diagram illustrating portion "A" of the display device illustrated in FIG. 1.

Referring to FIGS. 1 and 2, a display device 500 in the example embodiment may include a circuit substrate 300 having a driving circuit, and an LED cell array 100 disposed on the circuit substrate 300 and providing a plurality of pixels 10. The driving circuit may include a transistor such as a thin film transistor (TFT).

In the example embodiment, the circuit substrate 300 may have a rectangular planar structure, but may have a different shape of structure. In example embodiments, the circuit substrate 300 may have a planar structure having a predetermined curvature or may include a flexible substrate.

The LED cell array 100 may include a plurality of LED modules PM disposed on the circuit substrate 300 and each of the plurality of LED modules PM may provide a plurality of pixels 10. In the example embodiment, each of the plurality of LED modules PM may include four of the pixels 10, but an example embodiment thereof is not limited thereto, and each of the plurality of LED modules PM may include a different number of pixels 10. In example embodiments, each of the plurality of LED modules PM may include several tens of thousands of pixels (e.g., 100×100 arrangement, that is, 10,000 pixels).

The display device 500 in the example embodiment may be implemented by dividing an entire display area into a plurality of regions, and transferring the plurality of corresponding LED modules PM onto the divided areas, respectively. Accordingly, each of the plurality of LED modules PM may be considered as a partial module or a divisional module.

Gaps d1, d2, and d3 (e.g., widths) may be formed among the plurality of LED modules PM aligned on the circuit substrate 300. The region between the plurality of LED modules PM may be filled with a gap-fill layer 160G. As the gaps d1, d2, and d3 among the plurality of LED modules PM are formed according to a deviation (hereinafter, referred to as align deviation) which may occur when the plurality of LED modules PM are aligned, the gaps d1, d2, and d3 may be different depending on positions thereof as illustrated in FIG. 2. Due to the difference among the gaps d1, d2, and d3, the gap-fill layer 160G may have a different width. A difference in width of the gap-fill layer 160G may cause the issue in which a seam is visually perceived on a boundary of one of the LED modules PM. To address the above-described issue, various method for arranging sub-pixels SP1, SP2, and SP3 with a constant gap therebetween on the entire display area (especially, a boundary between the LED modules PM) may be provided in the example embodiment. Methods will be described with reference to various example embodiments illustrated in FIGS. 5 to 16.

As illustrated in FIGS. 1 and 2, the plurality of LED modules PM may not be disposed in an edge region of the circuit substrate 300. An edge protective layer 160E surrounding the plurality of aligned LED modules PM may be formed in the edge region. In example embodiments, the edge protective layer 160E may be formed by the same process as the process for forming the gap-fill layer 160G. For example, the edge protective layer 160E may have a thickness substantially the same as a thickness of the gap-fill layer 160G, but may have a width greater than that of the gap-fill layer 160G. In example embodiments, the edge protective layer 160E may be formed of the same material as that of the gap-fill layer 160G. For example, the gap-fill layer 160G and the edge protective layer 160E may include a light blocking material such as a black matrix or a light reflective material.

In the example embodiment, the plurality of LED modules PM may be configured to provide pixels 10 having the same size, that is, having the same arrangement, but in another example embodiment, at least one of the plurality of LED modules (PM) may be configured to provide pixels having different sizes and/or different arrangements.

As illustrated in FIG. 2, each of the plurality of pixels 10 may include a plurality of sub-pixels (e.g. first to third sub-pixels SP1, SP2, and SP3). In the example embodiment, each of the plurality of pixels 10 may include three of the sub-pixels, but may include a different number of sub-pixels (see FIG. 8B).

Figure 3A:
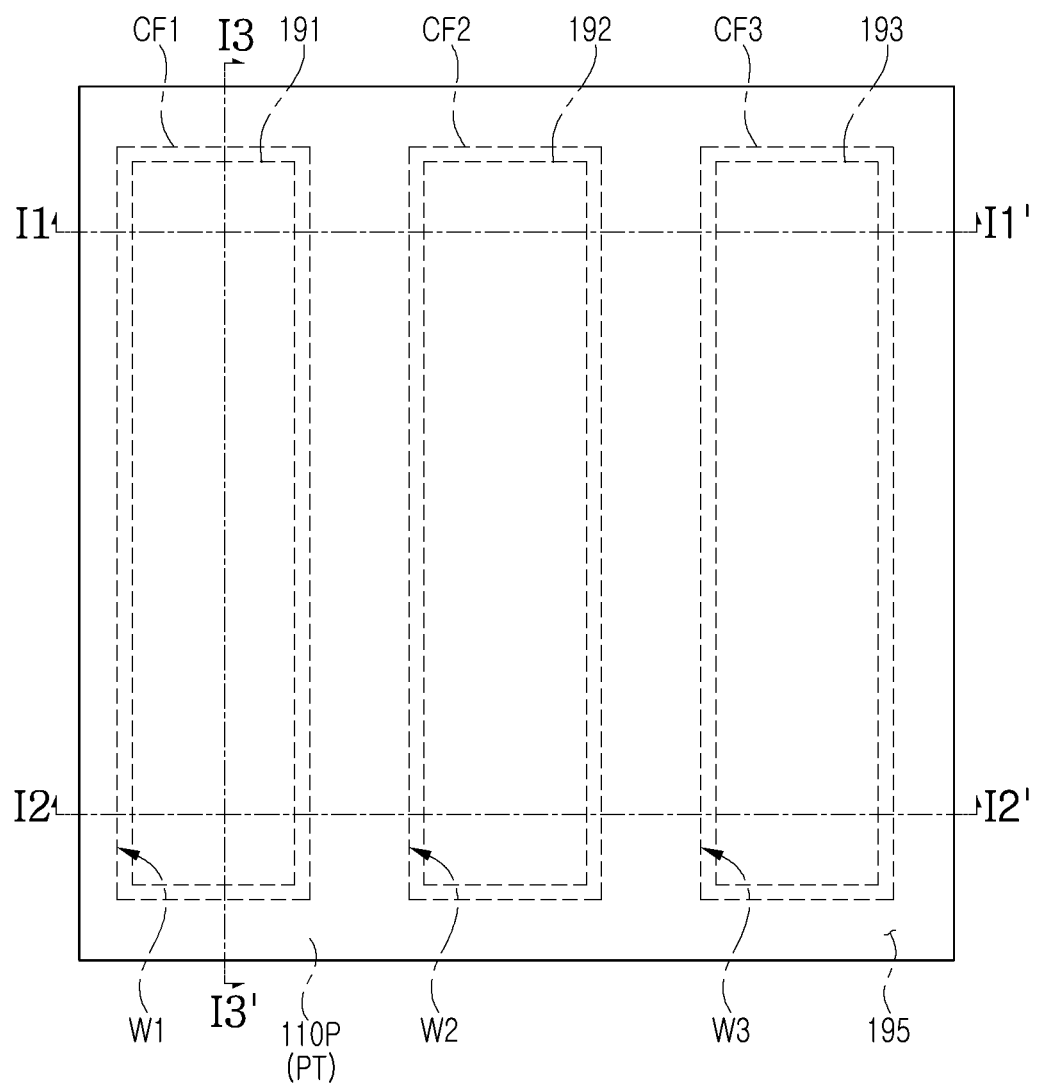
FIG. 3A is a plan diagram illustrating a single pixel (an LED module portion) of the display device illustrated in FIG. 1 viewed from a top.
Figure 3B:
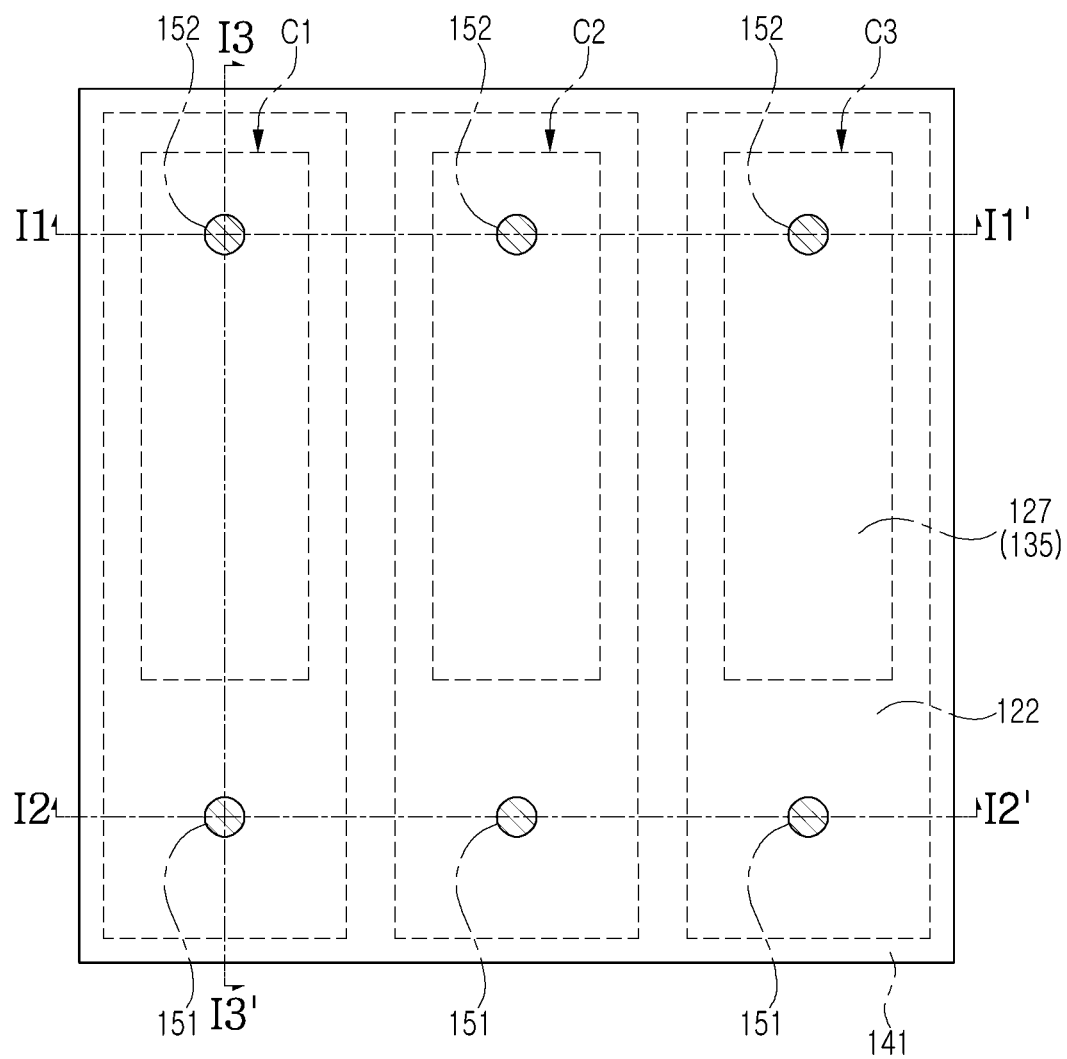
FIG. 3B is a plan diagram illustrating the single pixel (the LED module portion) of the display device illustrated in FIG. 1 viewed from a bottom.
Figure 4A:
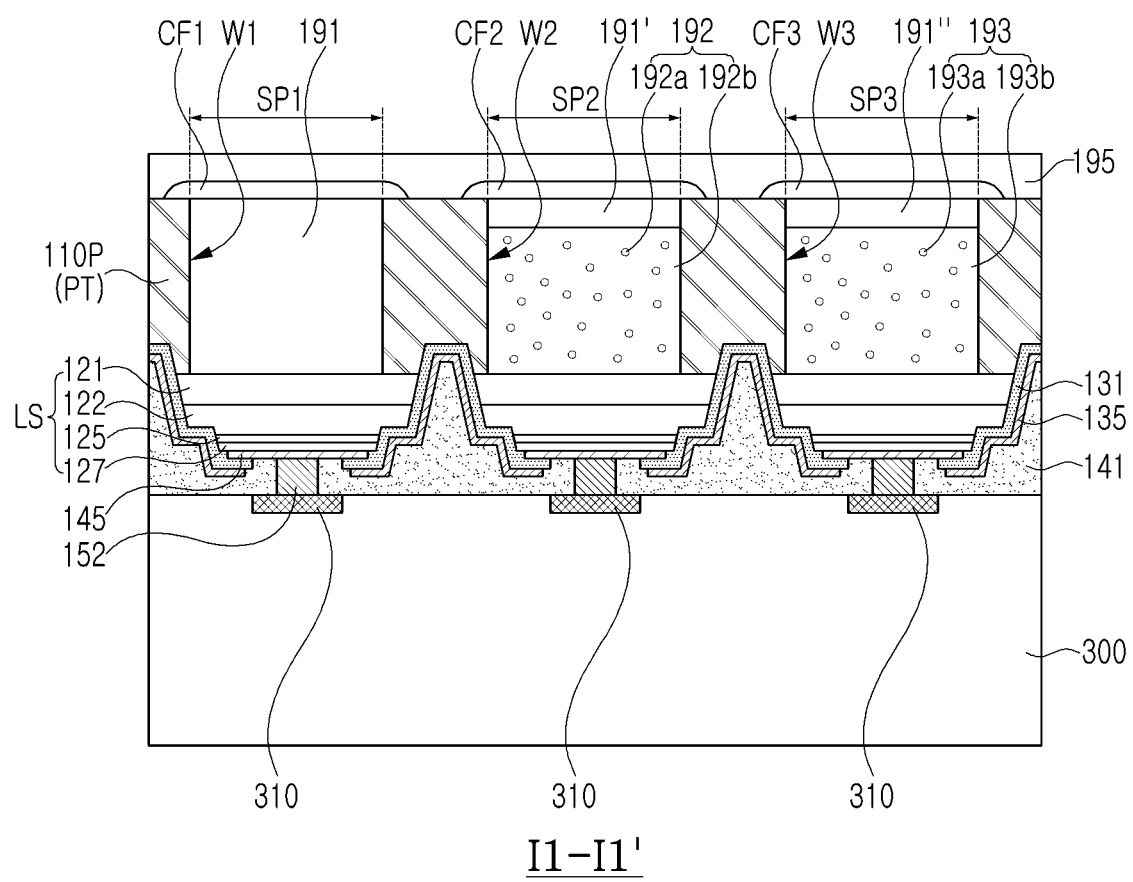
FIG. 4A is a side cross-sectional diagram illustrating the pixel illustrated in FIGS. 3A and 3B along line I1-I1'.
Figure 4B:
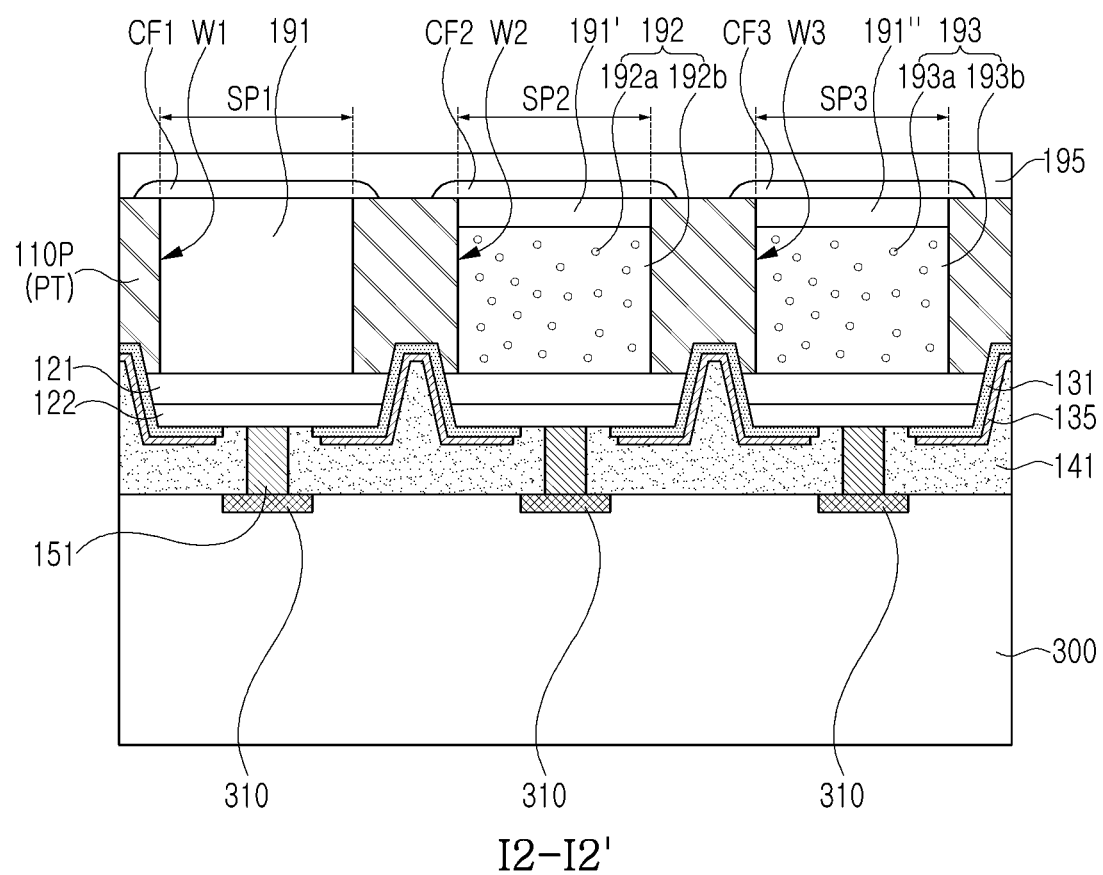
FIG. 4B is a side cross-sectional diagram illustrating the pixel illustrated in FIGS. 3A and 3B along line I2-I2'.
Figure 4C:
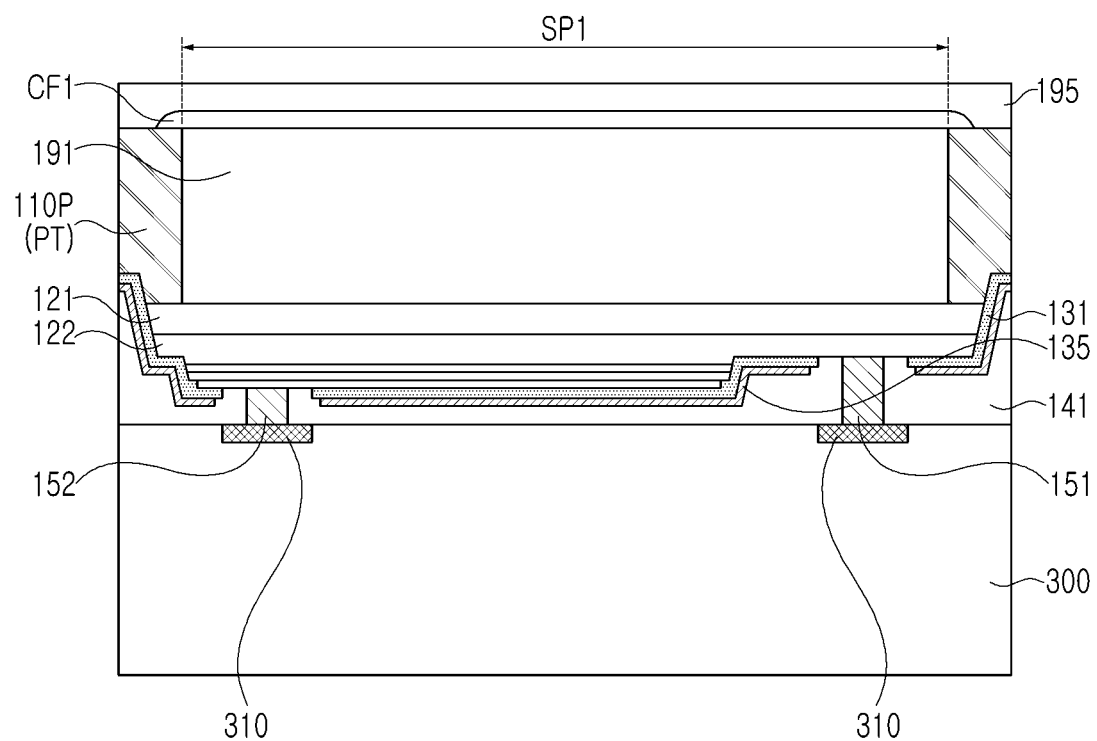
FIG. 4C is a side cross-sectional diagram illustrating the pixel illustrated in FIGS. 3A and 3B along line I3-I3'.

FIGS. 3A and 3B are plan diagrams illustrating a single pixel (an LED module portion) of the display device illustrated in FIG. 1 viewed from a top and a bottom. FIGS. 4A to 4C are side cross-sectional diagrams illustrating the pixel illustrated in FIGS. 3A and 3B along lines I1-I1', I2-I2', and I3-I3', respectively.

Referring to FIGS. 3A and 3B and FIGS. 4A to 4C, the pixel in the example embodiment may include first to third sub-pixels SP1, SP2, and SP3 forming a portion (that is, ¼) of the LED module and emitting different colors of light. The first to third sub-pixels SP1, SP2, and SP3 may include first to third LED cells C1, C2, and C3 as light sources, respectively.

In the example embodiment, the first to third sub-pixels SP1, SP2, and SP3 may be configured to emit different colors of light to display a color image. For example, the first to third sub-pixels SP1, SP2, and SP3 may be configured to emit blue, green, and red light, respectively.

As illustrated in FIGS. 4A to 4C, a color of light emitted from the first to third sub-pixels SP1, SP2, and SP3 may be determined by the first to third LED cells C1, C2, and C3 and/or the first and second color conversion layers 192 and 193.

In the example embodiment, the first to third LED cells C1, C2, and C3 may include a semiconductor stack LS which may emit blue light or ultraviolet light. The semiconductor stack LS may include a plurality of epitaxial layers obtained by the same growth process. The plurality of epitaxial layers may include an undoped semiconductor layer 121, a first conductivity-type semiconductor layer 122, an active layer 125, and a second conductivity-type semiconductor layer 127.

In example embodiments, each of the plurality of epitaxial layers may include a nitride semiconductor. For example, the undoped semiconductor layer 121 may include GaN. The first conductivity-type semiconductor layer 122 may include a nitride semiconductor satisfying n-type $In_xAl_yGa_{1-x-y}N$ ($0 \leq x < 1$, $0 \leq y < 1$, $0 \leq x+y < 1$), where n-type impurities may include Si, Ge, Se or Te. The active layer 125 may have a multiple quantum well (MQW) structure in which a quantum well layer and a quantum barrier layer are alternately stacked. For example, the quantum well layer and the quantum barrier layer may be configured as $In_xAl_yGa_{1-x-y}N$ ($0 \leq x \leq 1$, $0 \leq y \leq 1$, $0 \leq x+y \leq 1$) having different compositions. In an example embodiment, the quantum well layer may be $In_xGa_{1-x}N$ ($0 < x \leq 1$), and the quantum barrier layer may be GaN or AlGaN. The active layer 125 may be configured to emit substantially the same light. For example, as described above, the active layer 125 may be configured to emit blue light (e.g., 440 nm to 460 nm) or ultraviolet or near ultraviolet light (e.g., 380 nm to 440 nm). The second conductivity-type semiconductor layer 127 may include a nitride semiconductor layer satisfying p-type $In_xAl_yGa_{1-x-y}N$ ($0 \leq x < 1$, $0 \leq y < 1$, $0 \leq x+y < 1$), wherein the p-type impurities may include Mg, Zn or Be.

A partition structure PT disposed on the semiconductor stack LS may include first to third light emitting windows W1, W2, and W3 at positions corresponding to the first to third LED cells C1, C2, and C3. In the example embodiment, the first to third light emitting windows W1, W2, and W3 may define a sub-pixel area, and may have the same shape and size. The partition structure PT in the example embodiment may include a single crystal used as a substrate for growing the semiconductor stack LS. The single crystal for the partition structure PT may have light blocking properties. For example, the single crystal may include silicon (Si).

As illustrated in FIGS. 4A and 4B, first and second color conversion layers 192 and 193 may be disposed in at least a portion of the first to third light emitting windows W1, W2, and W3. In the example embodiment, the first and second color conversion layers 192 and 193 may be disposed on the second and third light emitting windows W2 and W3, respectively, and may convert light from the second and third sub-pixels SP2 and SP3 into different colors of light. For example, the first to third LED cells C1, C2, and C3 may be configured to emit blue light, the first and second color conversion layers 192 and 193 may be configured to convert light into red light and green light, respectively, and a transparent material layer 191 may be disposed in the first light emitting window W1 to emit blue light. For example, the first and second color conversion layers 192 and 193 may include transparent resin portions 192b and 193b in which first and second wavelength conversion materials 192a and 193a are mixed, respectively. The first and second wavelength conversion materials 192a and 193a may be phosphors or quantum dots.

In the example embodiment, first and second transparent layers 191' and 191" may be disposed on the first and second color conversion layers 192 and 193 in the second and third light emitting windows W2 and W3, respectively. The first and second transparent layers 191' and 191" may be configured to have substantially the same plane as an upper surface of the partition structure PT. The transparent material layer 191 may also be formed together with the first and second transparent layers 191' and 191" and may have substantially the same plane as an upper surface of the partition structure PT. Color filter layers may be easily formed on the planarized upper surfaces. In the example embodiment, first to third color filter layers CF1, CF2, and CF3 may be disposed on the transparent material layer 191 and the first and second transparent layers 191' and 191", respectively. The first to third color filter layers CF1, CF2, and CF3 may be a blue color filter layer, a green color filter layer, and a red color filter layer, respectively. The first to third color filter layers CF1, CF2, and CF3 may increase color purity of light emitted from the first to third light emitting windows W1, W2, and W3. Also, the transparent protective layer 195 may be disposed on the partition structure PT to cover the first to third color filter layers CF1, CF2, and CF3.

A protective insulating film 131 may be disposed on side surfaces and a portion of lower surface regions of the first to third LED cells C1, C2, and C3. For example, the protective insulating film 131 may include at least one of SiO, SiN, SiCN, SiOC, SiON, and SiOCN. A reflective layer 135 may be disposed on an area of the protective insulating film 131 disposed among the first to third LED cells C1, C2, and C3. The reflective layer 135 may also extend to a region of the protective insulating film 131 disposed on lower surfaces of the first to third LED cells C1, C2, and C3. The reflective layer 135 may include a reflective metal layer, a distributed Bragg reflective (DBR) layer, or an omni-directional reflective (ODR) layer. For example, the reflective metal layer may include Ag, Ni or Al. When the reflective layer 135 is a DBR layer, the protective insulating film 131 may not be provided.

A filling insulating portion 141 may be disposed on the protective insulating film 131 to fill regions among the first to third LED cells C1, C2, and C3. In the example embodiment, the filling insulating portion 141 may be disposed to cover lower surfaces of the first to third LED cells C1, C2, and C3. In example embodiments, the filling insulating portion 141 may include silicon oxide or a silicon oxide-based insulating material. For example, the filling insulating portion 141 may be tetraethyl ortho silicate (TEOS), undoped silicate glass (USG), phosphosilicate glass (PSG), borosilicate glass (BSG), borophosphosilicate glass (BPSG), fluoride silicate glass (FSG), spin on glass (SOG), tonen silazene (TOSZ), or a combination thereof An ohmic contact layer 145 may be formed on the second conductivity-type semiconductor layer 127 of the first to third LED cells C1, C2, and C3. In example embodiments, the ohmic contact layer 145 may include a highly reflective ohmic contact layer. For example, the ohmic contact layer 145 may include a material such as Ag, Ni, Al, Cr, Rh, Pd, Ir, Ru, Mg, Zn, Pt, Au, or the like, and may have a single layer structure or a two or more layer structure. However, an example embodiment thereof is not limited thereto, and the ohmic contact layer 145 may include a light-transmitting conductive layer such as an indium tin oxide (ITO).

A first electrode 151 connected to the first conductivity-type semiconductor layer 122 may be formed to penetrate the filling insulating portion 141 (see FIGS. 4B and 4C). Similarly, a second electrode 152 connected to the second conductivity-type semiconductor layer 127 (in particular, the ohmic contact layer 145) may be formed to penetrate the filling insulating portion 141 (see FIGS. 4B and 4C). For example, the first and second electrodes 151 and 152 may include at least one of Cu, Al, Au, Cr, Ni, Ti, and Sn.

The LED module PM in the example embodiment may be configured to include the plurality of pixels 10 as described above. In the LED module PM, the plurality of pixels 10 may also have an single structure in which the plurality of pixels 10 are connected to each other, similarly to the first to third sub-pixels SP1, SP2, and SP3.

Figure 5:
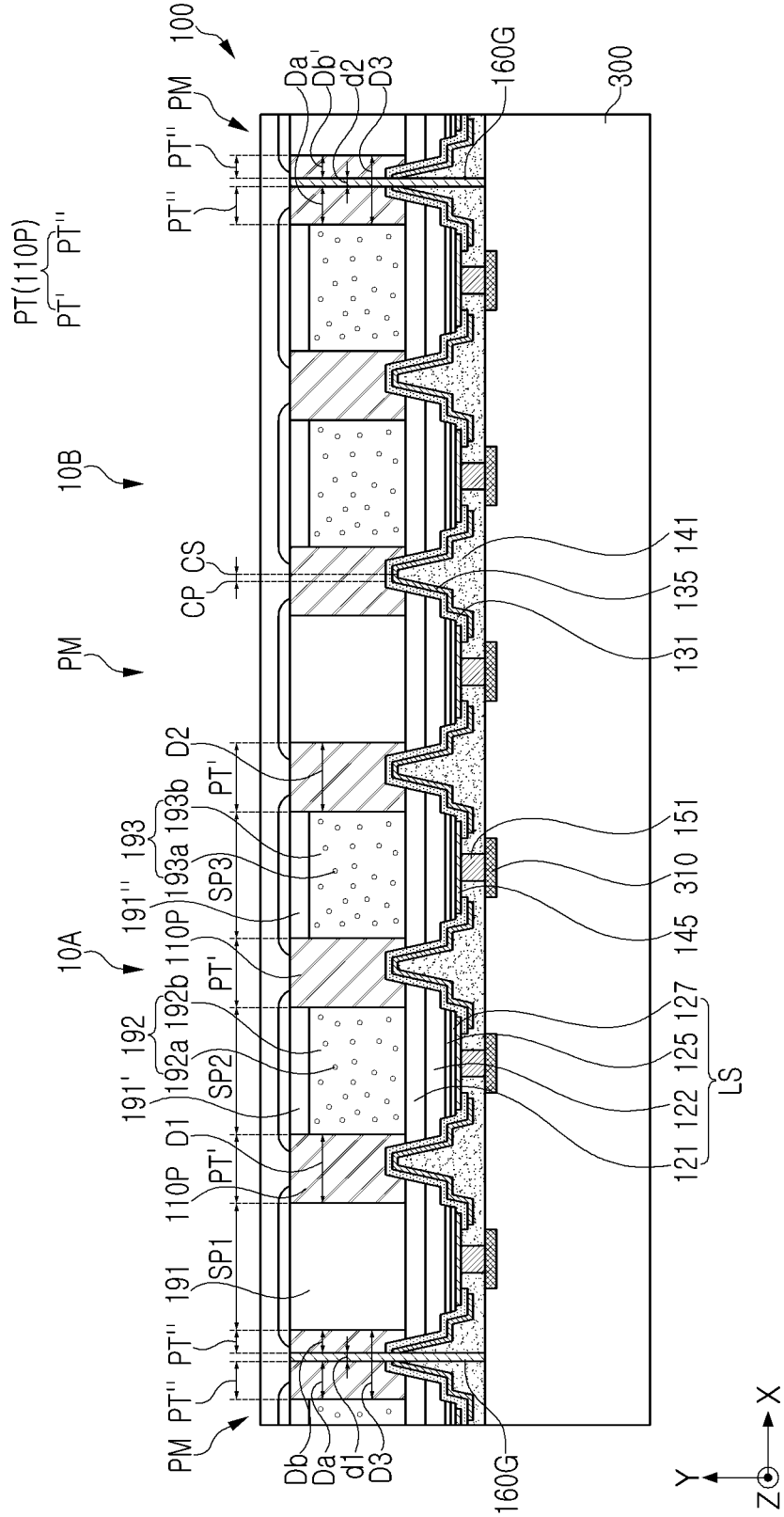
FIG. 5 is a side cross-sectional diagram illustrating the display device illustrated in FIG. 1 along line II-II' in FIG. 2.

FIG. 5 is a side cross-sectional diagram illustrating the display device illustrated in FIG. 1 along line II-II' in FIG. 2.

Referring to FIG. 5, the LED module PM in the example embodiment may include two pixels 10A and 10B connected in a single structure. Each of the pixels 10A and 10B may include first to third sub-pixels SP1, SP2, and SP3 arranged with a gap D1 that is the same as each other. A gap D2 between adjacent sub-pixels in the pixels 10A and 10B that are adjacent. That is, a gap D2 between the third sub-pixel SP3 of the pixel 10A and the first sub-pixel SP1 of the pixel 10B, may be substantially the same as each gap D1 among adjacent sub-pixels SP1, SP2, and SP3 in each of the pixels 10A and 10B.

The LED module PM may be connected to another, adjacent one or more of the LED modules PM and disposed on the circuit substrate 300 by a gap-fill layer 160G (see FIG. 2). A gap D3 between adjacent sub-pixels disposed between adjacent ones of the LED modules PM, that is, the gap D3 between the third sub-pixel SP3 of one of the LED modules PM and the first sub-pixel SP1 of another, adjacent one of the LED modules PM, may also be substantially the same as the gaps D1 among the adjacent ones of the first to third sub-pixels SP1, SP2, and SP3 in each of the pixels 10A and 10B.

As described above, the first to third sub-pixels SP1, SP2, and SP3 throughout an entirety of the LED cell array 100 may be arranged such that the gaps D1, D2, D3 are substantially the same. In the example embodiment, the gaps D1, D2, D3 among adjacent ones of the first to third sub-pixels SP1, SP2, and SP3 may be defined by the partition structure PT, and the partition structure PT may be configured such that a plurality of light emitting windows W1, W2, and W3 may be arranged with the gaps D1, D2, D3 being substantially the same.

Specifically, the first to third light emitting windows W1, W2, and W3 disposed in each of the LED modules PM may be arranged with the gap D1 and the gap D2 being the same, and the gaps D1 and D2 may be substantially the same as the gap D3 among adjacent ones of the first to third light emitting windows W1, W2, and W3 disposed between adjacent LED modules PM of the plurality of LED modules PM.

The partition structure PT in the example embodiment may include the same single crystal as described above, and may include a plurality of partitions corresponding to the plurality of LED modules PM, respectively. The gap-fill layer 160G may extend to a region between the plurality of partitions of the partition structure PT. The plurality of partitions of the partition structure PT may be connected to each other by the gap-fill layer 160G.

In the example embodiment, the partition structure PT may be formed by transferring the LED modules PM onto the circuit substrate 300 (see FIG. 6C), forming the gap-fill layer 160G between the LED modules PM that are transferred (see FIG. 6D), and processing a growth substrate 110. Accordingly, the first to third light emitting windows W1, W2, and W3 having the same size and shape may be formed with the same gap (gap D1=gap D2=gap D3) while being arranged on the circuit substrate 300. The sum (Da+d1+Db or Da'+d2+Db') of the widths (Da+Db and Da'+Db') of adjacent outer portions PT" and widths d1 and d2 of the gap-fill layer 160G disposed therebetween may be the same as widths D1 and D2 of inner portions PT' thereof.

For example, in the plurality of the structures of the partition structure PT, when a width Da, Db of the outer portion PT" is less than a width D1 and D2 of the inner portion PT' surrounded by the outer portion PT", a width (e.g., d1<d2) of the gap-fill layer 160G may be varied according to a width (e.g., Da+Db>Da'+Db') of the outer portions PT" adjacent to the gap-fill layer 160G.

As the first to third light emitting windows W1, W2, and W3 arranged with the same gap (gap D1=gap D2=gap D3) are formed by processing the growth substrate 110 after the LED module PM is transferred, in at least a partial region, a gap among the first to third light emitting windows W1, W2, and W3 may slightly mismatch a gap among the LED cells C1, C2, and C2. Specifically, as illustrated in FIG. 5, a vertical line CS passing through a center of an area between adjacent ones of the first and second LED cells C1 and C2 of the plurality of LED cells may be offset from a vertical line CP passing through a center of a portion of the partition structure PT disposed in a region between the adjacent ones of the first and second LED cells C1 and C2 in a horizontal direction. In example embodiments, the offset may occur among most of the first to third LED cells C1, C2, and C3.

The LED module PM in the example embodiment may be defined by a gap-fill layer 160G as illustrated in FIG. 2. The LED module PM may have a single structure formed by combining the first to third LED cells C1, C2, and C3. In other words, the LED module PM may include a filling insulating portion 141 having a continuous single structure for combining the first to third LED cells C1, C2, and C3 by filling a space among the plurality of LED cells C1, C2, and C3. The filling insulating portion 141 may have a continuous single structure without disconnection among the first to third LED cells C1, C2, and C3. The protective insulating film 131 and the reflective layer 135 may also have a continuous single structure without disconnection among the first to third LED cells C1, C2, and C3, similarly to the filling insulating portion 141.

In the example embodiment, an example in which a gap between sub-pixels may be implemented to be constant in one direction (e.g., an x direction), but similarly to the example embodiment, a gap between sub-pixels between adjacent LED modules may be implemented to be constant in another direction (e.g., a y direction). The gap between the light-emitting windows in the y direction may be different from the gap between the light-emitting windows in the x direction, but in example embodiments, the gap formed in both directions may be implemented to be the same.

FIGS. 6A to 6F are cross-sectional diagrams illustrating main processes of a method of manufacturing a display device according to an example embodiment.

Figure 6A:
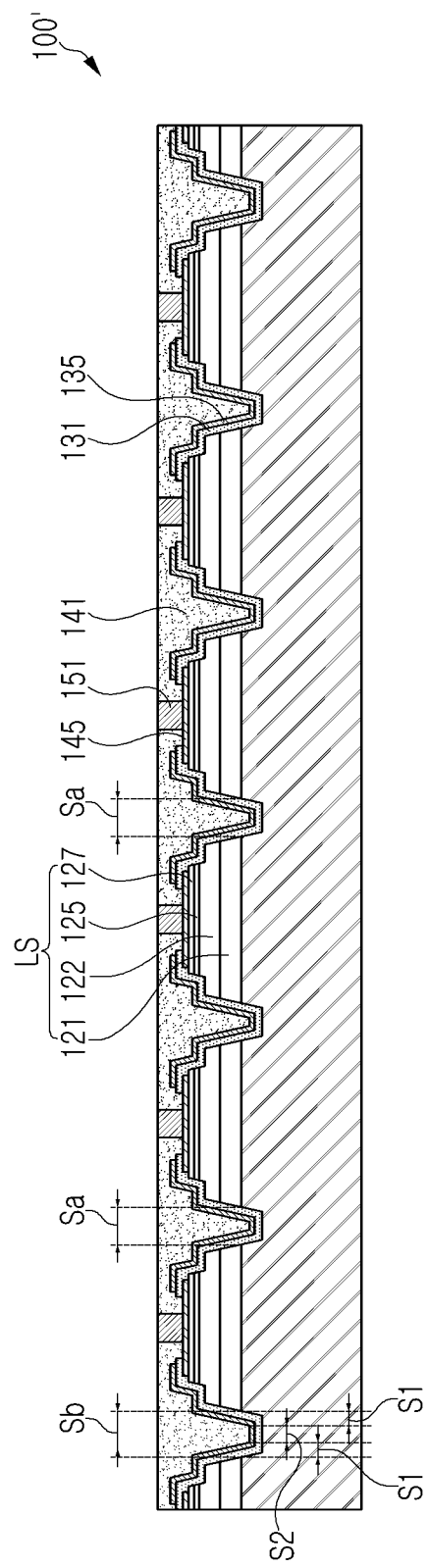
FIG. 6A is a first cross-sectional diagram illustrating main processes of a method of manufacturing a display device according to an example embodiment of the present disclosure.

Referring to FIG. 6A, a plurality of LED cells C1, C2, C3 may be formed on a growth substrate 110 such that a wafer 100' in which a plurality of LED cells are implemented may be formed.

In the example embodiment, the growth substrate 110 may be configured as a substrate for growing a semiconductor stack LS for first to third LED cells C1, C2, and C3, and may include a single crystal having light blocking properties. For example, the growth substrate 110 may be implemented as a silicon substrate. An undoped semiconductor layer 121, a first conductivity-type semiconductor layer 122, an active layer 125, and a second conductivity-type semiconductor layer 127 may be formed in order on the growth substrate 110. The semiconductor stack LS may include a nitride semiconductor. For example, the growth process may be performed by a metal organic chemical vapor deposition (MOCVD) process. An ohmic contact layer 145 may be formed on the second conductivity-type semiconductor layer 127 of the first to third LED cells C1, C2, and C3.

Also, the semiconductor stack LS may be divided by the first to third LED cells C1, C2, and C3. This dividing process may be performed such that the growth substrate 110 may be exposed. First gap Sa and second gap Sb (e.g., widths), that are divisional gaps, among the first to third LED cells C1, C2, and C3 may be determined in consideration of an LED module PM to be transferred. The semiconductor stack LS for the first to third LED cells C1, C2, C3 in a single LED module PM may be divided by a first gap Sa of a same size, and an LED cell (a third LED cell C3 or a first LED cell C1) of an adjacent LED module PM may be divided from an LED (a first LED cell C1 or a third LED cell C3) of the single LED module PM with a second gap Sb different from the first gap Sa. The second gap Sb may be greater than the first gap Sa in consideration of a width S2 of a portion to be removed in a cutting process (see FIG. 6B) for the LED module PM. After the cutting process, a width S1 of an edge region to be left of the LED module PM may be similar to a half of the first gap Sa, and may be determined to be relatively smaller than a half of the first gap Sa in consideration of alignment deviation generated during a transfer process.

A protective insulating film 131 may be formed on surfaces of the first to third LED cells C1, C2, and C3. The protective insulating film 131 may be formed relatively conformally. A reflective layer 135 may be formed on a region of the protective insulating film 131 disposed among the first to third LED cells C1, C2, and C3. A filling insulating portion 141 may be formed on the protective insulating film 131 to fill a space among the first to third LED cells C1, C2, and C3. First and second electrodes 151 and 152 connected to the first and second conductivity-type semiconductor layers 122 and 127, respectively, may be formed to penetrate the filling insulating portion 141.

Figure 6B:
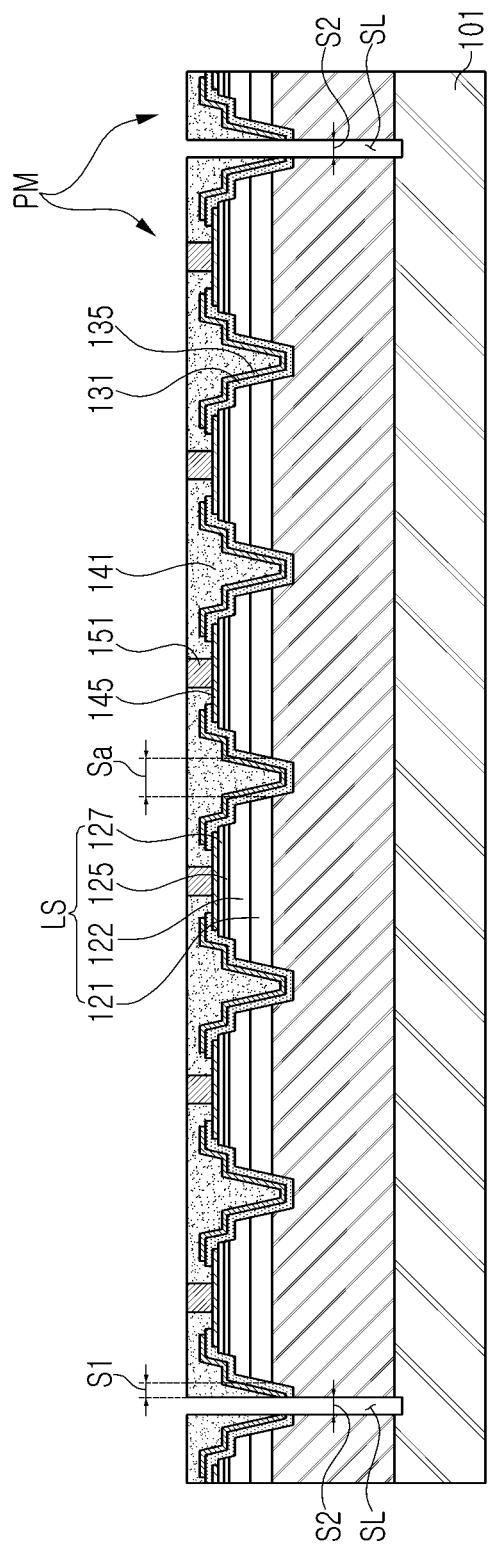
FIG. 6B is a second cross-sectional diagram illustrating main processes of the method of manufacturing the display device according to the example embodiment of the present disclosure.

Thereafter, referring to FIG. 6B, an LED module PM, including first to third LED cells C1, C2, C3, may be cut in preparation to be transferred.

The growth substrate 110 manufactured in FIG. 6A may be attached to the carrier substrate 101, and a cutting process may be performed. The cutting process may be performed by a blade dicing process or a plasma etching process. A scribing area SL disposed between the LED modules PM may be removed by a predetermined width S2 through the cutting process. After the cutting process, an edge region of the LED module PM may remain with a constant width S1. As described above, the width S1 of the edge region may be determined to be relatively smaller than a half the first gap Sa in consideration of alignment deviation occurring during the transfer process, and alignment deviation generated in a subsequent transfer process (see FIG. 6C) may be compensated by a width of the gap-fill layer 160G.

Figure 6C:
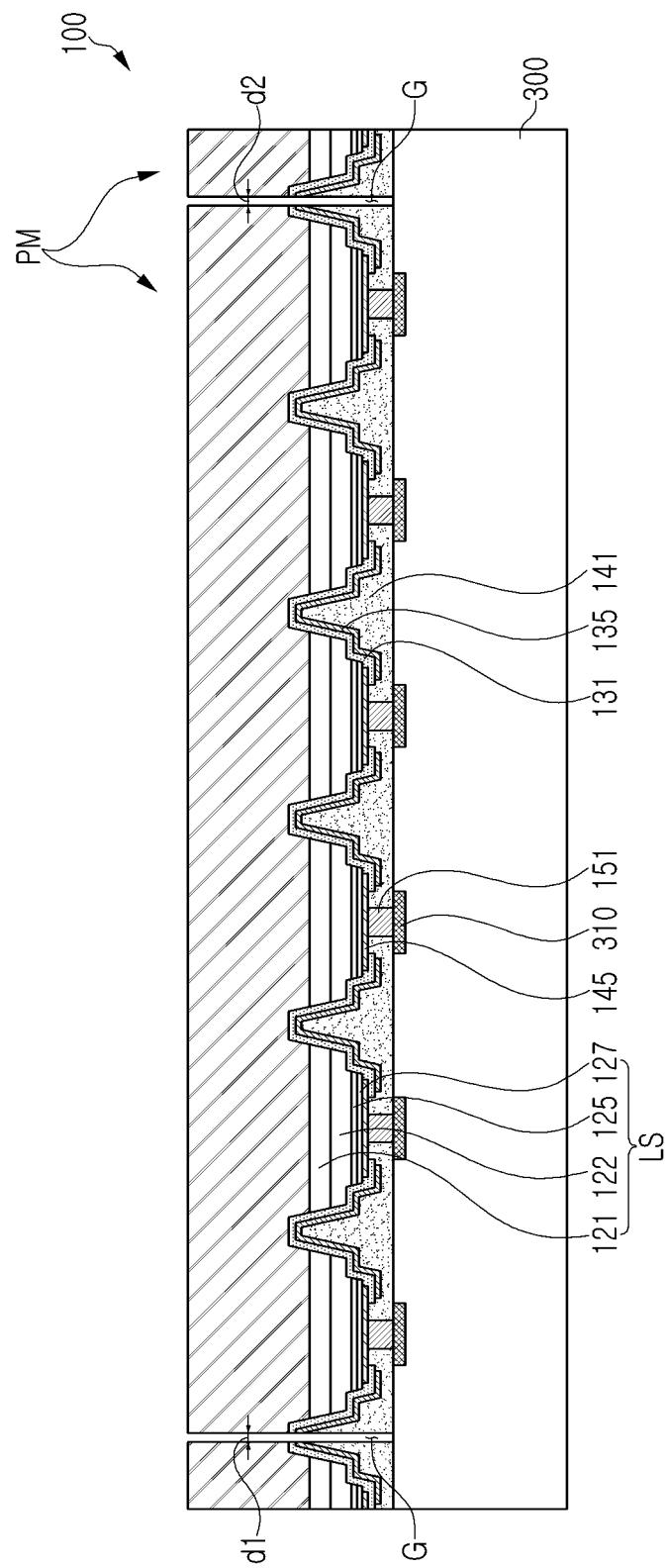
FIG. 6C is a third cross-sectional diagram illustrating main processes of the method of manufacturing the display device according to an example embodiment of the present disclosure.

Thereafter, referring to FIG. 6C, the LED module PM may be transferred onto the circuit substrate 300.

After the transfer process, a process of bonding the first and second electrodes 151 and 152 of the LED module PM with a pad 310 of the circuit substrate 300 to be connected to a driving circuit of the circuit substrate 300. The bonding process may be implemented by a process such as a bump bonding process, a fusion bonding process, a Cu—Cu bonding process, or a hybrid bonding process which is a Cu—Cu bonding process or an oxide-oxide bonding process. As described above, the LED modules PM that is transferred may be aligned to have a gap G between other, adjacent ones of the LED modules PM due to alignment deviation. The gap G between the LED modules PM may have different gaps d1 and d2 depending on positions thereof.

Figure 6D:
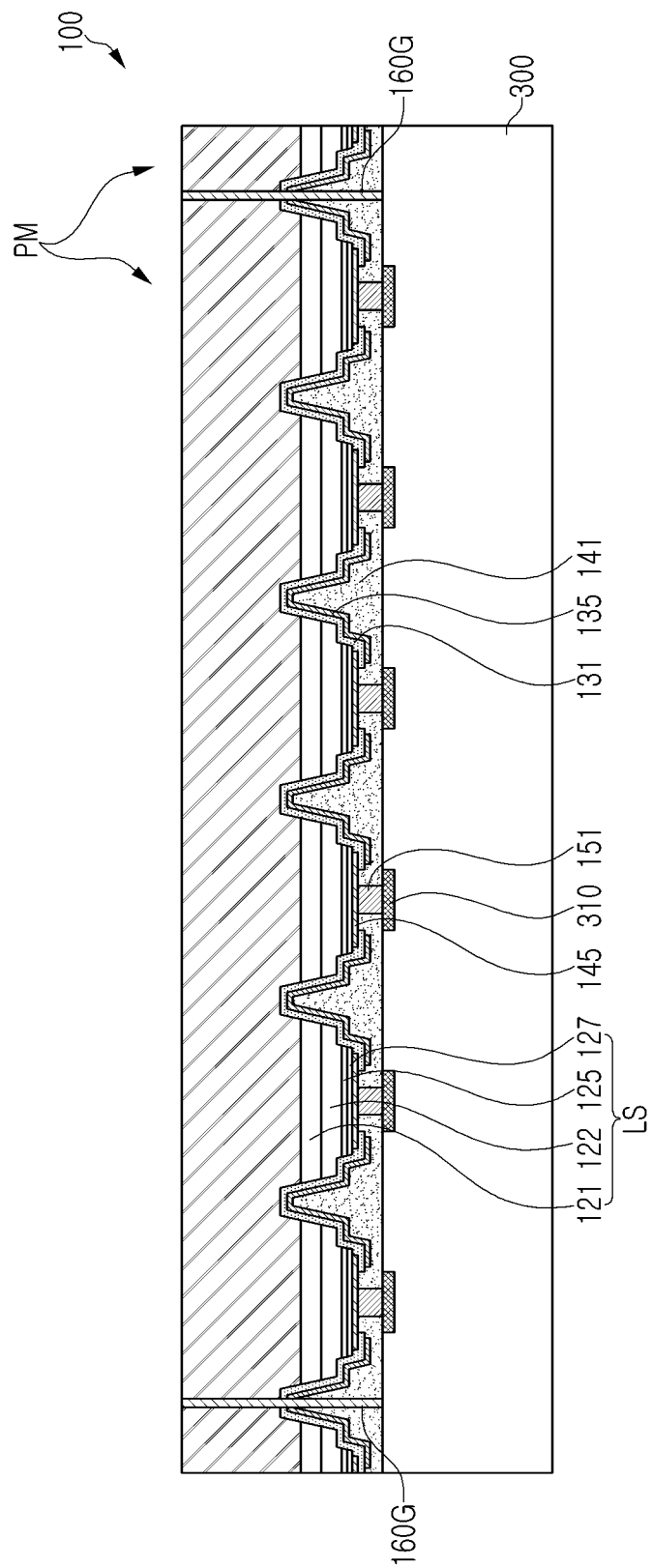
FIG. 6D is a fourth cross-sectional diagram illustrating main processes of the method of manufacturing the display device according to the example embodiment of the present disclosure.

Referring to FIG. 6D, a gap-fill layer 160G for filling the gap G between the LED modules PM may be formed.

In this process, a gap-fill material may be formed over an entire upper surface of the growth substrate 110 to fill the gaps d1 and d2 between the LED modules PM, and the gap-fill material on the growth substrate 110 may be partially removed. In the example embodiment, the gap-fill layer 160G may include a light blocking material or a light reflective material. For example, the gap-fill layer 160G may include a black matrix or a highly reflective resin such as an epoxy molding compound (EMC). The gap-fill layer 160G is not limited thereto, and may include a light-transmitting material such as spin-on glass (SOG), but in the example embodiment, a light blocking pattern BP illustrated in FIG. 10E may be added.

Figure 6E:
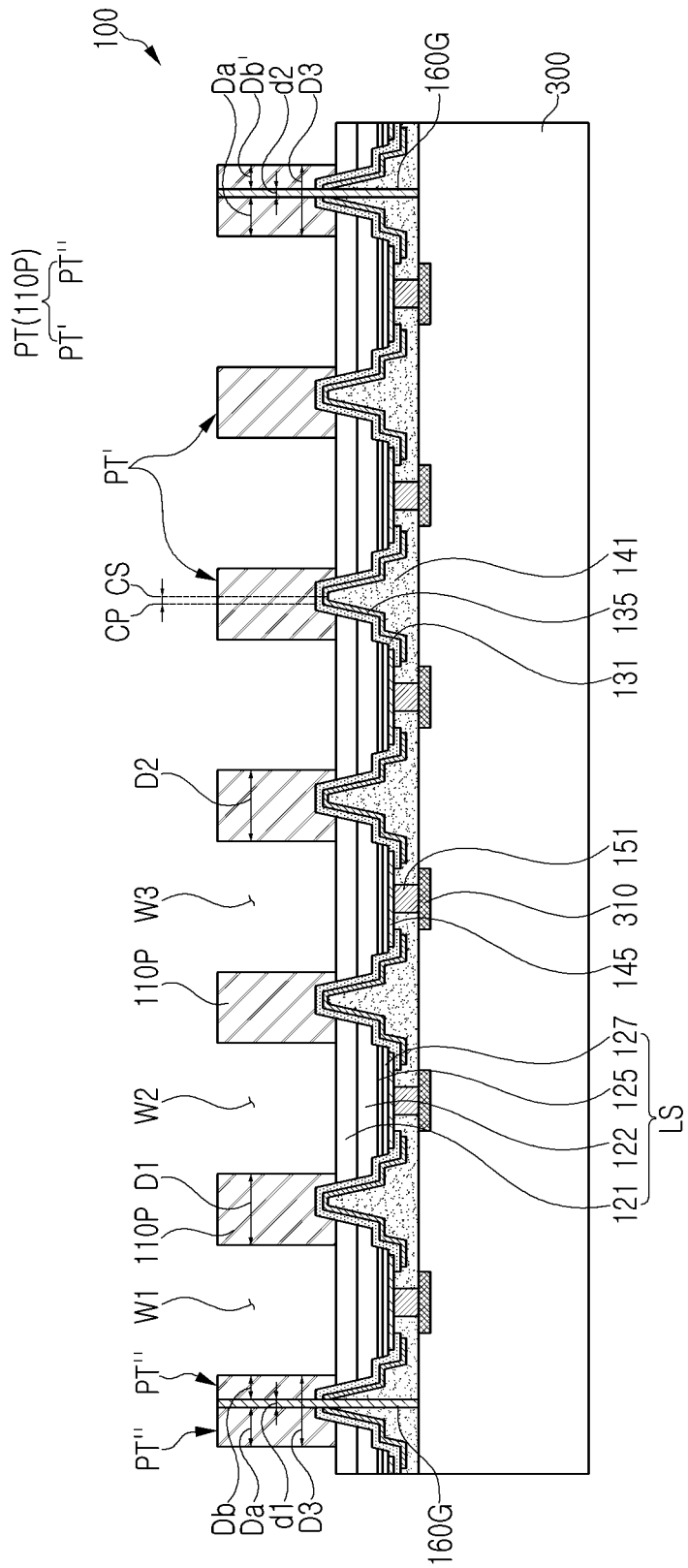
FIG. 6E is a fifth cross-sectional diagram illustrating main processes of the method of manufacturing the display device according to the example embodiment of the present disclosure.

Thereafter, referring to FIG. 6E, the growth substrate 110 may be processed to form a partition structure PT having first to third light emitting windows W1, W2, and W3.

In the example embodiment, as the plurality of LED modules PM are arranged on the circuit substrate 300 and form the LED cell array 100, the first to third light emitting windows W1, W2, and W3 for defining sub-pixels may be formed with the same gap (gap D1=gap D2=gap D3). Also, as the growth substrate 110 is formed of a light blocking material such as silicon, the growth substrate 110 may be provided as an effective partition structure. In this process, a sum (Da+d1+Db or Da'+d2+Db') of the widths (Da+Db, Da'+Db') of adjacent outer portions PT" of the partition structure and the widths d1 and d2 of the gap-fill layer 160G disposed therebetween may be the same as the widths D1 and D2 of the inner portions PT'.

As described above, after transferring/bonding the LED module PM, by processing the growth substrate 110, the partition structure PT having light emitting windows W1, W2, and W3 with the same gap (gap D1=gap D2=gap D3) may be easily formed. Also, due to this process, a vertical line CS passing through a center of a region between adjacent ones of first and second LED cells C1 and C2 of the plurality of LED cells may be offset from a vertical line CS passing a center of a portion of the partition structure PT disposed in a region between the adjacent ones of the first and second LED cells C1 and C2 in a horizontal direction.

Figure 6F:
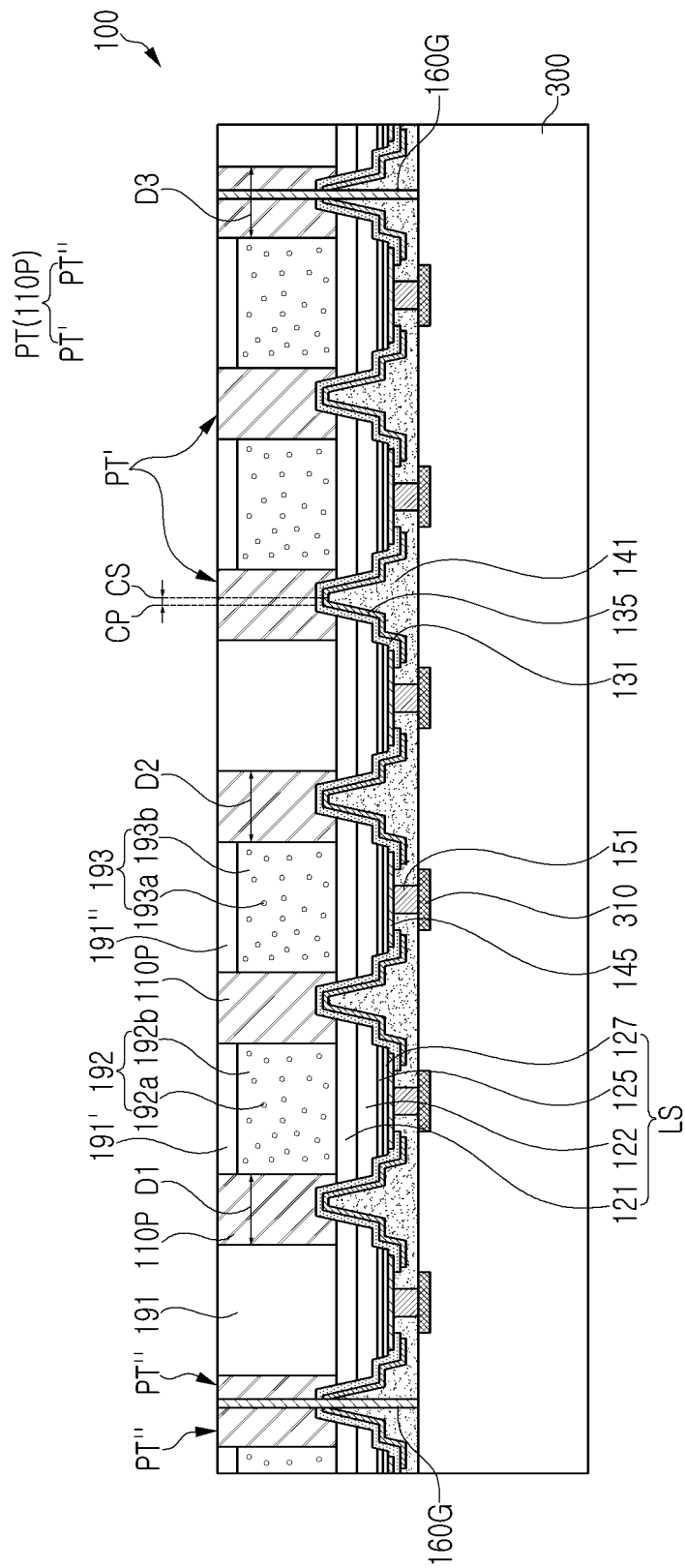
FIG. 6F is a sixth cross-sectional diagram illustrating main processes of the method of manufacturing the display device according to the example embodiment of the present disclosure.

Referring to FIG. 6F, sub-pixels emitting different colors of light may be provided by selectively forming first and second color conversion layers 192 and 193 in the second and third light emitting windows W2 and W3.

In the example embodiment, the first and second color conversion layers 192 and 193 may be formed in the second and third light emitting windows W2, and W3, respectively. The first and second color conversion layers 192 and 193 may be configured to convert light into red light and green light, respectively. For example, the first and second color conversion layers 192 and 193 may be formed by dispensing transparent resin portions 192b and 193b in which first and second wavelength conversion materials 192a and 193a are mixed. A transparent material layer 191 may be disposed in the first light emitting window W1 to emit blue light. First and second transparent layers 191' and 191" may be disposed on the first and second color conversion layers 192 and 193, respectively, in the second and third light emitting windows W2 and W3. The first and second transparent layers 191' and 191" may be configured to have substantially the same plane as an upper surface of the partition structure PT. The transparent material layer 191 may also be formed together with the first and second transparent layers 191' and 191".

Thereafter, blue, green and red color filter layers CF1, CF2, and CF3 may be disposed on the transparent material layer 191 and the first and second transparent layers 191' and 191" to cover the first to third light emitting windows W1, W2, and W3, respectively, and a transparent protective layer 195 may be additionally formed to cover the first to third color filter layers CF1, CF2, and CF3 such that the display device 500 illustrated in FIG. 5 may be manufactured.

As described above, in the example embodiment, the process of transferring the micro-LED may be simplified by dividing the display area and transferring the LED modules, which are partial modules corresponding to each divided area, onto the LED cell array. Also, by forming the partition structure having light emitting windows after the transfer/bonding process, alignment deviation may be addressed and the gap between the sub-pixels may be constant.

The LED module in the example embodiment may be configured to include at least one or a relatively small number of pixels, but in view of simplifying the transfer process, the LED module may include a great number of pixels, which are areas obtained by dividing the display device into several or several tens of ranges. For example, the LED module may be configured to include tens of thousands of pixels (e.g., a matrix of 100×100 or 200×200 pixels). This process may be described with reference to FIGS. 7A and 7B.

Figure 7A:
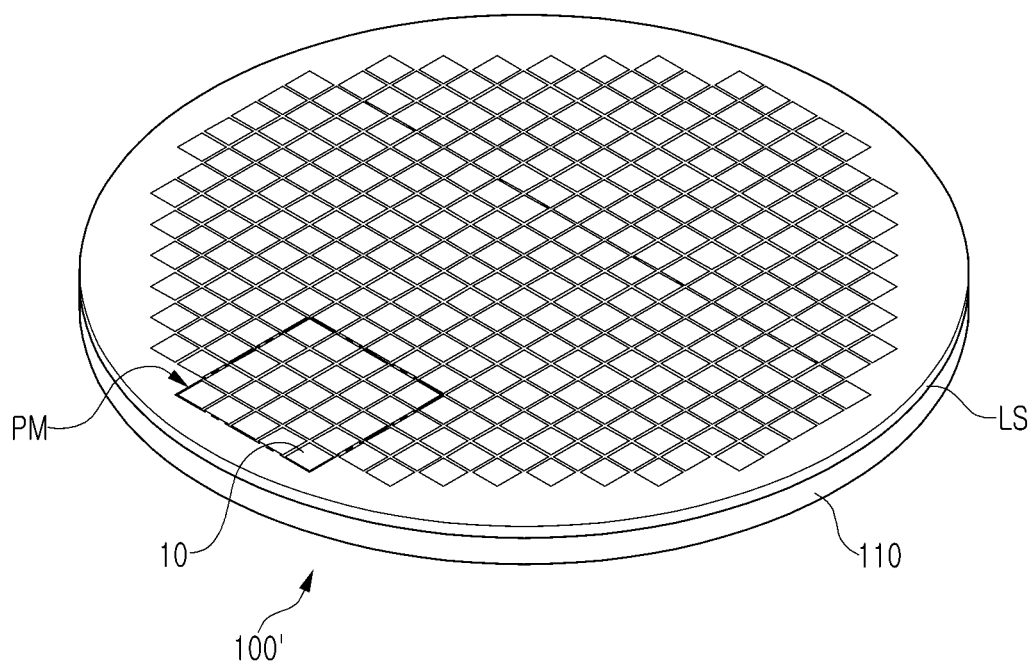
FIG. 7A is a perspective diagram illustrating a wafer on which an LED module is implemented.
Figure 7B:
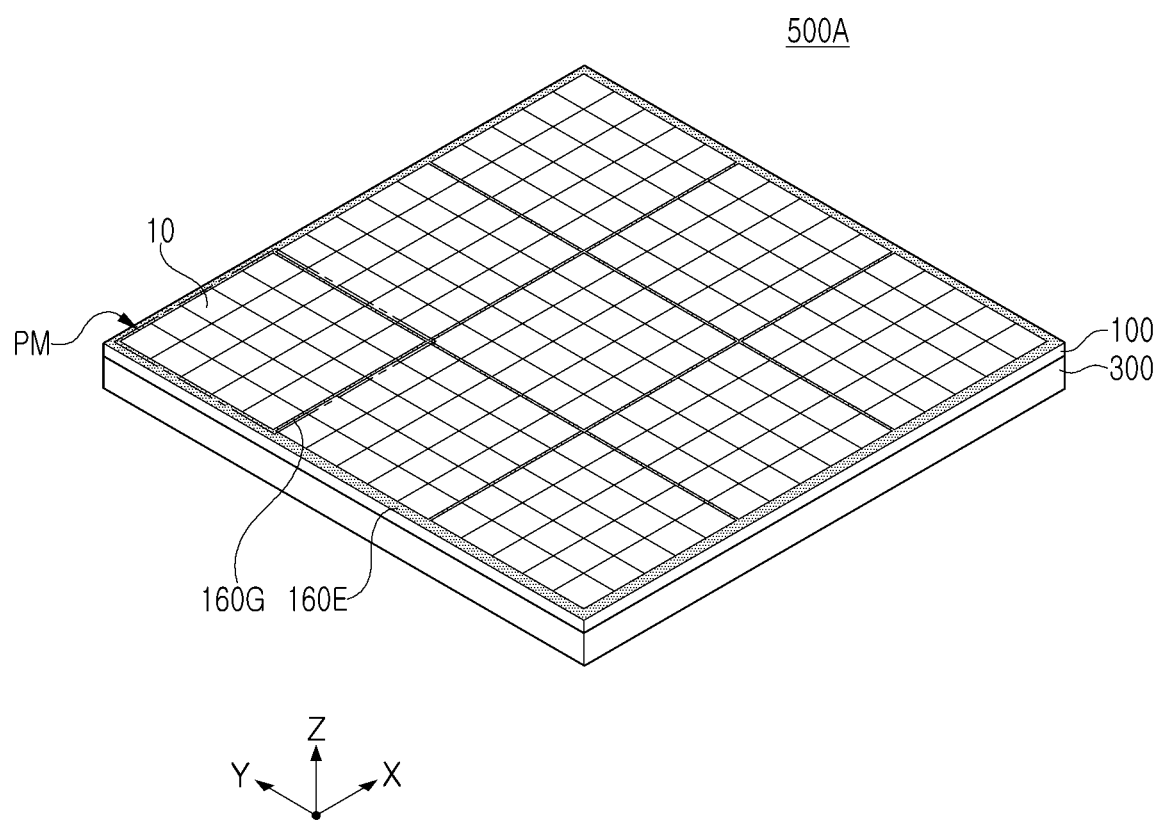
FIG. 7B is a perspective diagram illustrating a display device including the LED module illustrated in FIG. 7A.

FIG. 7A is a perspective diagram illustrating a wafer on which an LED module is implemented, and FIG. 7B is a perspective diagram illustrating a display device including the LED module illustrated in FIG. 7A.

FIG. 7A illustrates a wafer 100' in which a plurality of LED cells are formed. The wafer 100' may be understood as a result obtained through the processes described with reference to FIGS. 6A and 6B. A gap between the plurality of LED cells and pixels 10 may be formed in consideration of a gap between sub-pixels and a gap between pixels in a display device 500A illustrated in FIG. 7B. A gap between the plurality of LED cells and a gap between pixels 10 may be the same as or similar to final gaps at least within the LED module PM.

In the example embodiment, the LED module PM may be provided by cutting the wafer 100' by 5×5 pixel units. The LED module PM may be transferred to a circuit substrate 300 to implement a display device 500A as illustrated in FIG. 7B. The display device 500A in the example embodiment may include nine of the LED modules PM, and may be manufactured by performing a transfer process nine times.

The nine of the LED modules PM may be configured such that an edge portion of each of the LED modules PM may be smaller than a half the gap between the LED cells in consideration of alignment deviation to be generated during the transfer process, and accordingly, a gap may be formed between the LED modules PM that are aligned. The gap G may be filled with the gap-fill layer 160G. Also, a plurality of the LED modules PM may not be disposed in the edge region of the circuit substrate 300, and an edge protective layer 160E surrounding the plurality of the LED modules PM that are aligned may be formed in the edge region.

Figure 8A:
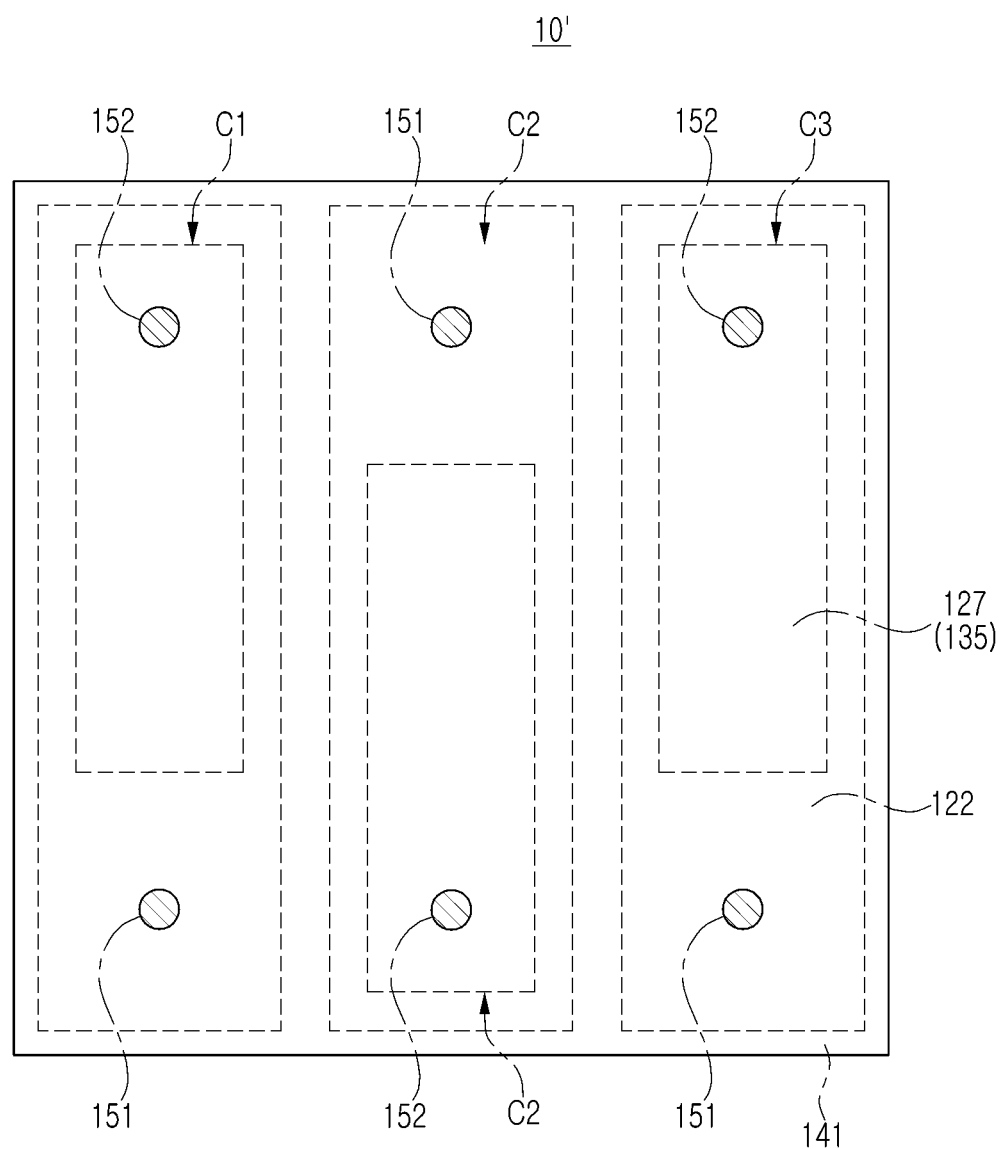
FIG. 8A is a plan diagram illustrating a layout of pixels (an LED module portion) employable in a display device, viewed from a bottom, according to an example embodiment of the present disclosure.
Figure 8B:
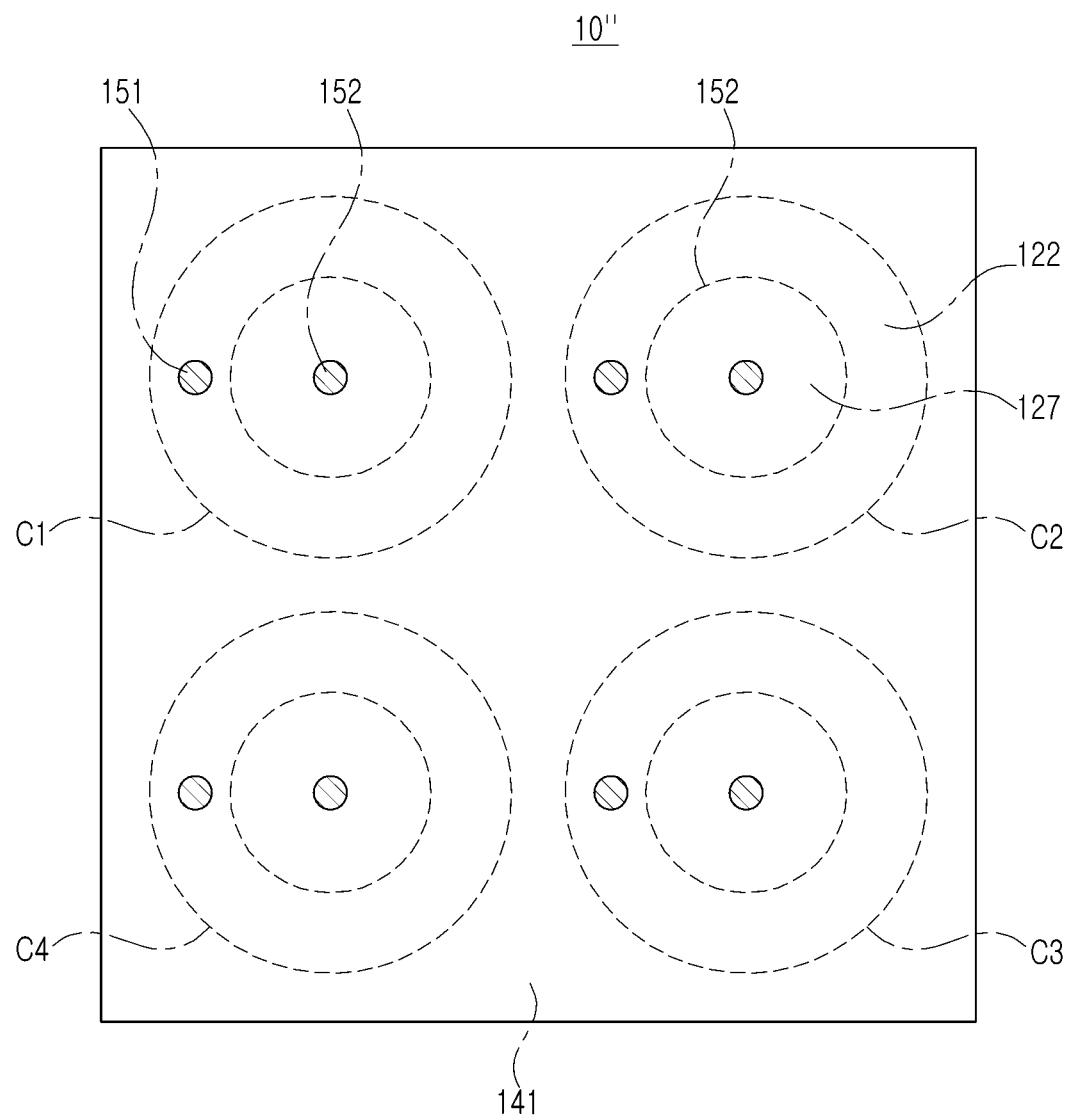
FIG. 8B is a plan diagram illustrating a layout of pixels (an LED module portion) employable in a display device, viewed from a bottom, according to an example embodiment of the present disclosure.

Each of the pixels 10 in the aforementioned example embodiment may have a substantially square-shaped plane as illustrated in FIGS. 3A and 3B, and may have a layout in which first to third sub-pixels SP1, SP2, and SP3 having the same rectangular-shaped plane may be arranged side by side in the plane. The layout of the plane of the pixels may be varied. FIGS. 8A and 8B are plan diagram illustrating a layout of various pixels (an LED module portion) employable in a display device, viewed from a bottom, according to an example embodiment.

Referring to FIG. 8A, a pixel 10' in the example embodiment may be similar to the pixel 10 illustrated in FIG. 3B other than the arrangement of the first and second electrodes 151 and 152. Also, the elements in the example embodiment may be understood with reference to the descriptions of the same or similar elements of the pixel 10 illustrated in FIGS. 3A to 4C unless otherwise indicated.

The pixel 10' in the example embodiment may include a second LED cell C2 having first and second electrodes 151 and 152 disposed opposite to the arrangement of the electrodes of the first and third LED cells C1 and C3. As described above, even though the first to third LED cells C1, C2, and C3 have the same shape and size, positions of the electrodes of a portion of the second LED cell C2 may be arranged differently from the arrangement of the positions of the electrodes of the other LED cells (e.g., first LED cell C1 and third LED cell C3).

Referring to FIG. 8B, the pixel 10" in the example embodiment may include first to fourth LED cells C1, C2, C3, and C4, differently from the pixel 10 illustrated in FIG. 3B. The first to fourth LED cells C1, C2, C3, and C4 in the example embodiment may have a circular semiconductor stack. At least a portion of the first to fourth LED cells C1, C2, C3, and C4 may be configured as four sub-pixels for emitting different colors of light. For example, the first to third cells C1, C2, and C3 may be configured as respective sub-pixels to emit red light, green light, and blue light, respectively, and the remaining one sub-pixel (the fourth cell C4) may be configured to emit one of the three colors (e.g., green light). As described above, the number of LED cells included in a single pixel may not be limited to three.

FIGS. 9A to 9D are cross-sectional diagrams illustrating main processes of a method of manufacturing a display device according to an example embodiment The method of manufacturing a display device in the example embodiment may include a process of forming a gap-fill layer and a partition structure by a method different from the manufacturing method described in the aforementioned embodiment, and may include a process of forming the wafer 100' in which a plurality of LED cells are implemented, a process of cutting for an LED module, and a process of transferring the LED module on to a circuit substrate, similarly to the process illustrated in FIGS. 6A to 6C.

Specifically, in the example embodiment, a partition structure may be formed using a separate material after a growth substrate is removed, rather than forming the partition structure from the growth substrate. Also, in the process of forming the partition structure, the gap-fill layer may be formed without a separate process for forming a gap-fill layer.

Figure 9A:
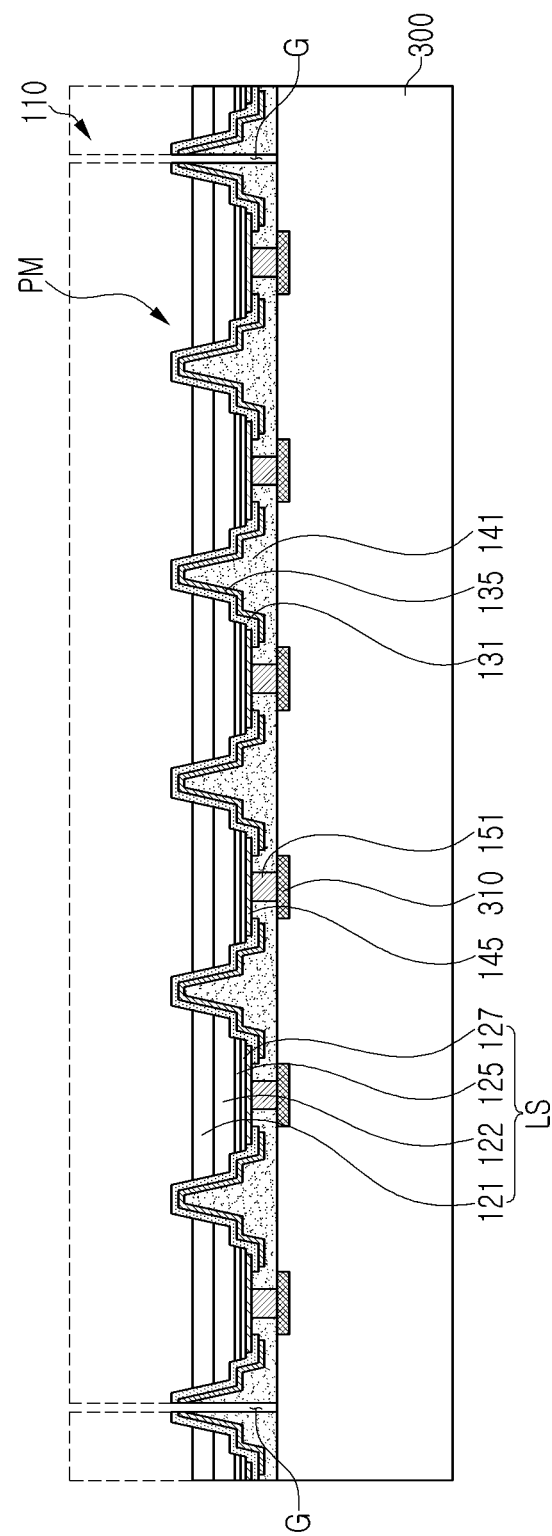
FIG. 9A is a first cross-sectional diagram illustrating main processes of a method of manufacturing a display device according to an example embodiment of the present disclosure.

Referring to FIG. 9A, the growth substrate 110 of the first to third LED cells C1, C2, and C3 may be removed from the circuit substrate 300 onto which the LED module PM is transferred.

The growth substrate 110 disposed on the LED module PM may be selectively removed using a plasma etching process. After the growth substrate 110 is removed, a protective insulating film 131 and a reflective layer 135 disposed among the LED cells C1, C2, and C3 may remain in a convex form.

Figure 9B:
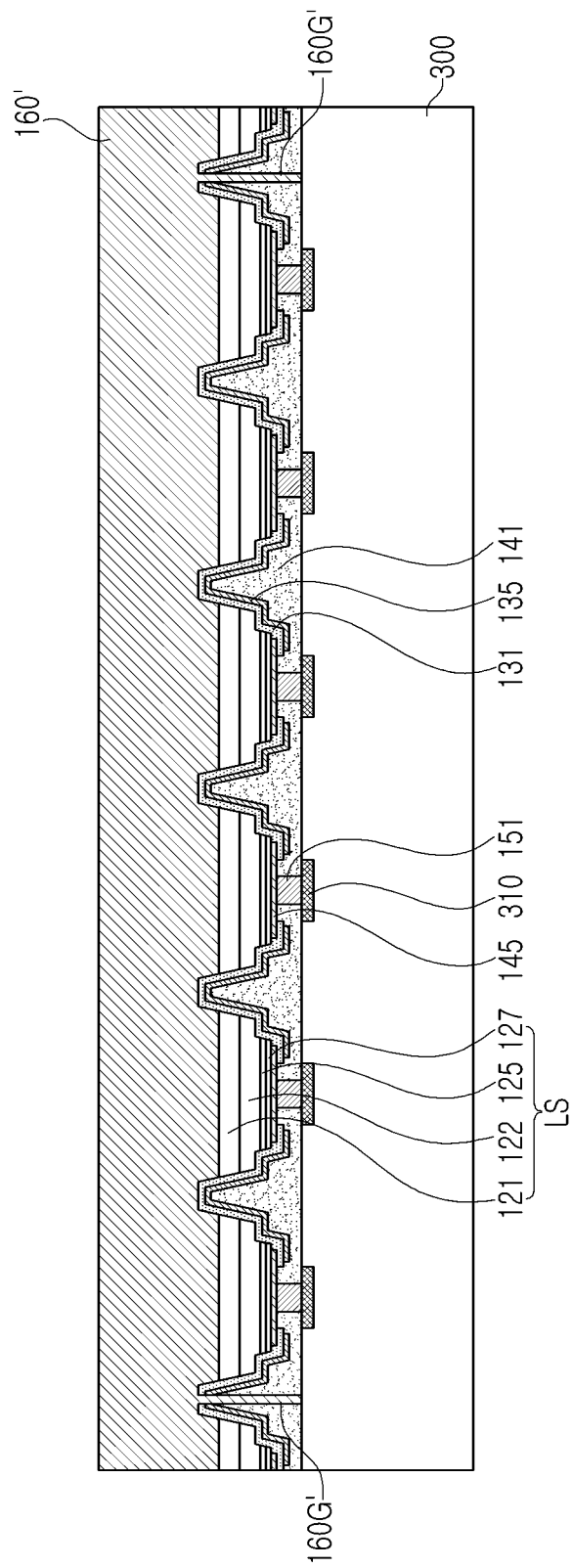
FIG. 9B is a second cross-sectional diagram illustrating main processes of the method of manufacturing the display device according to the example embodiment of the present disclosure.

Thereafter, referring to FIG. 9B, a material layer 160' for a partition structure may be formed on a surface from which the growth substrate 110 is removed.

In this process, the material layer 160' for the partition structure may provide a gap-fill layer 160G' by filling a gap G between the LED modules PM. The material layer 160' for the partition structure may include a light blocking material or a light reflective material. Differently from the aforementioned embodiment, the gap-fill layer 160G' in the example embodiment may be only provided between the LED modules PM, and may be connected to the partition structure 160P (in FIG. 9C). The gap-fill layer 160G formed as above may include a material that is the same as the material layer for the partition structure.

The material layer 160' for the partition structure may include, for example, a black matrix or a highly reflective resin such as EMC. The material layer 160' for the partition structure is not limited thereto, and may include a light-transmitting material such as spin-on glass (SOG), but in the example embodiment, the light blocking pattern BP illustrated in FIG. 10E may be added.

Figure 9C:
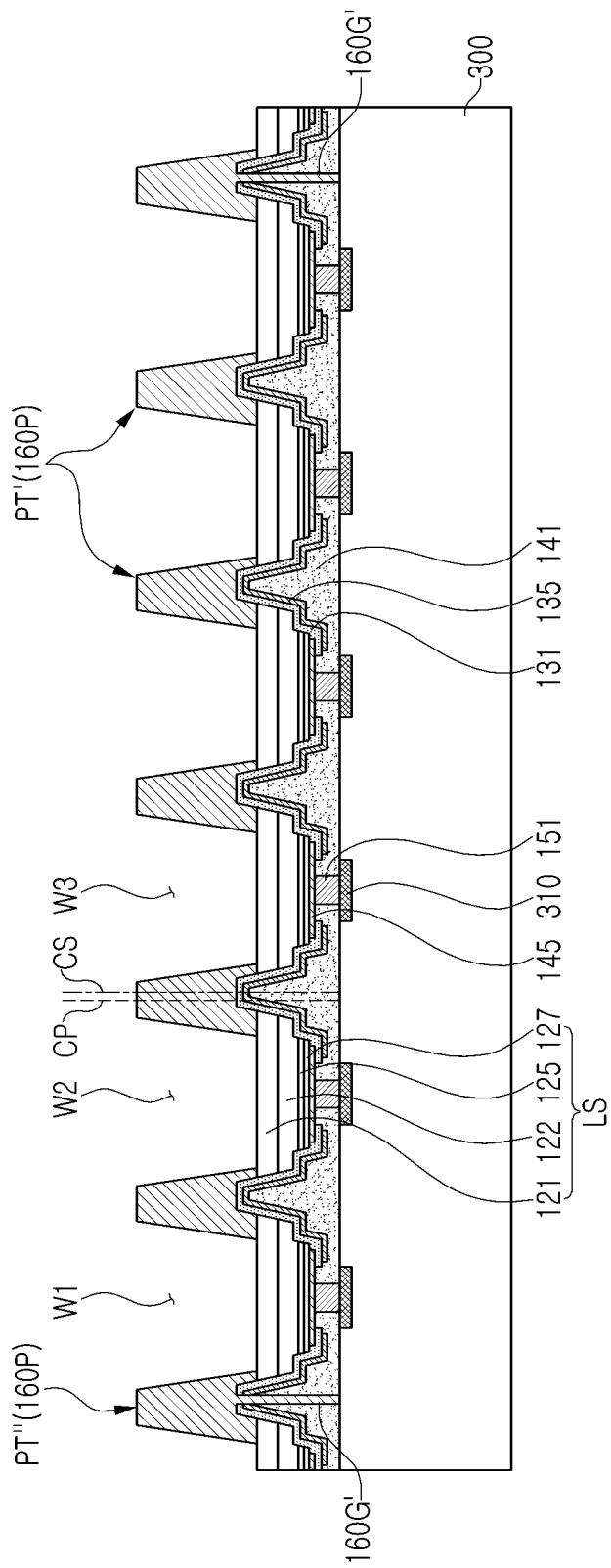
FIG. 9C is a third cross-sectional diagram illustrating main processes of the method of manufacturing the display device according to the example embodiment of the present disclosure.

Thereafter, referring to FIG. 9C, a partition structure 160P having first to third light emitting windows W1, W2, and W3 may be formed by processing the material layer 160' for the partition structure.

In the example embodiment, as the plurality of LED modules PM are arranged on the circuit substrate 300 and form an LED cell array 100, the first to third light emitting windows W1, W2, and W3 processed on the material layer 160' for the partition structure and defining sub-pixels may be formed with a desired gap therebetween. The partition structure 160P in the example embodiment may be provided in a single structure in an entire display area, rather than being divided by an LED module PM unit.

Also, as the partition structure 160P is formed by removing the growth substrate 110 after transferring/bonding the LED module PM, and processing the material layer 160' separately provided, a width of the partition structure 160P and a gap among the first to third light emitting windows W1, W2, and W3 may be formed to be constant over the entire area.

In this process, differently from the gap among the first to third LED cells C1, C2, and C3, a gap among the light emitting windows W1, W2, and W3 may be determined such that, similarly to the aforementioned embodiment, a vertical line CS passing through a center of a region between adjacent LED cells of the plurality of LED cells may be offset from a vertical line CP passing through a center of a portion of the partition structure 160P disposed on a region between the adjacent LED cells in a horizontal direction.

Figure 9D:
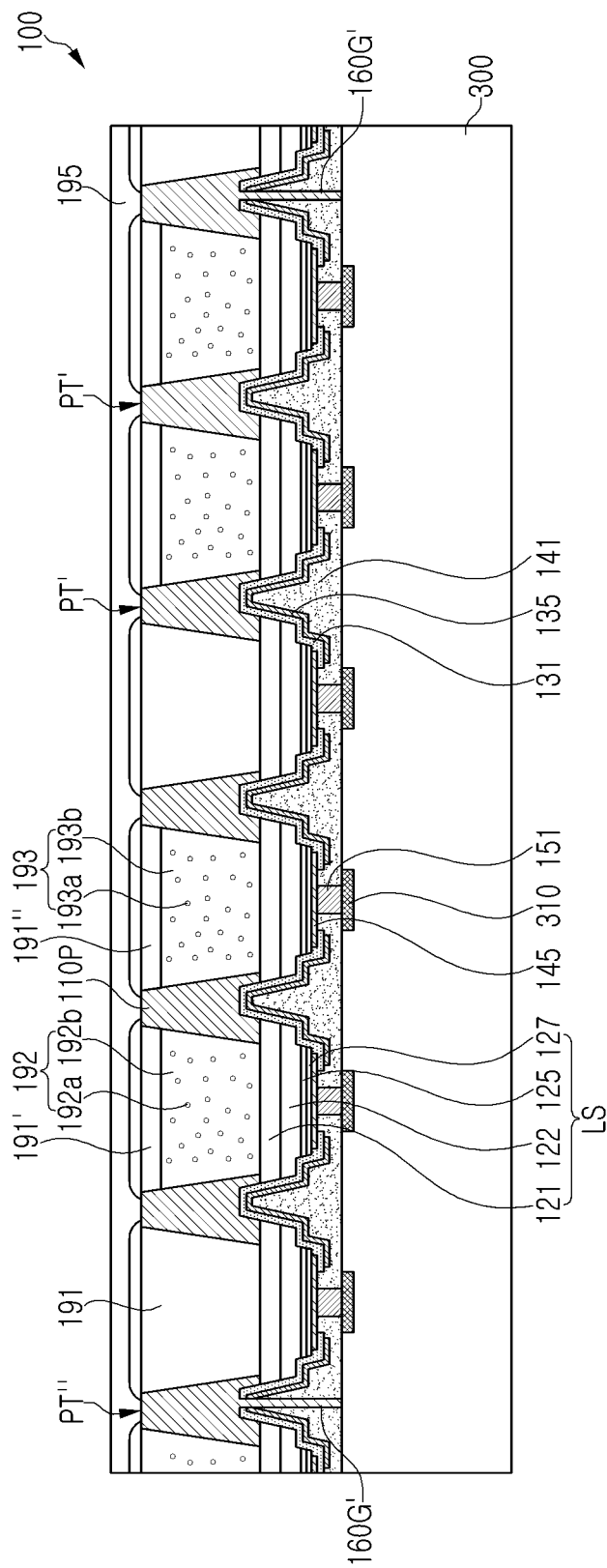
FIG. 9D is a fourth cross-sectional diagram illustrating main processes of the method of manufacturing the display device according to the example embodiment of the present disclosure.

Thereafter, referring to FIG. 9D, first to third sub-pixels for emitting different colors of light may be provided by selectively forming first and second color conversion layers 192 and 193 in the first to third light emitting windows W1, W2, and W3.

In the example embodiment, the first and second color conversion layers 192 and 193 may be formed in the second and third light emitting windows W2 and W3, respectively. The first and second color conversion layers 192 and 193 may be configured to convert light into red light and green light, respectively. First and second transparent layers 191' and 191" may be disposed on the first and second color conversion layers 192 and 193, respectively, in the second and third light emitting windows W2 and W3. The process of forming the first and second transparent layers 191' and 191" may be performed together with the process of forming the transparent material layer 191. Thereafter, first to third color filter layers CF1, CF2, and CF3 (e.g., blue, green, and red color filter layers) may be disposed on the transparent material layer 191 and the first and second transparent layers 191' and 191" to cover the first to third light emission windows W1, W2 and W3, and a transparent protective layer 195 may be additionally formed to cover the first to third color filter layers CF1, CF2, and CF3.

In the aforementioned example embodiment, an example in which the process of forming the partition structure 160P and the process of forming the first and second color conversion layers 192 and 193 may be performed after the transfer process, but the partition structure and the color conversion layers may be formed in the process of forming a wafer, that is, before the transfer process. In this case, by forming a light blocking pattern for defining an effective area of the light emitting window, the sub-pixels may be implemented with a constant gap.

FIGS. 10A to 10E are cross-sectional diagrams illustrating main processes of a method of manufacturing a display device according to an example embodiment. The process illustrated in FIG. 10A may be understood as a process subsequent to the process illustrated in FIG. 6B.

Figure 10A:
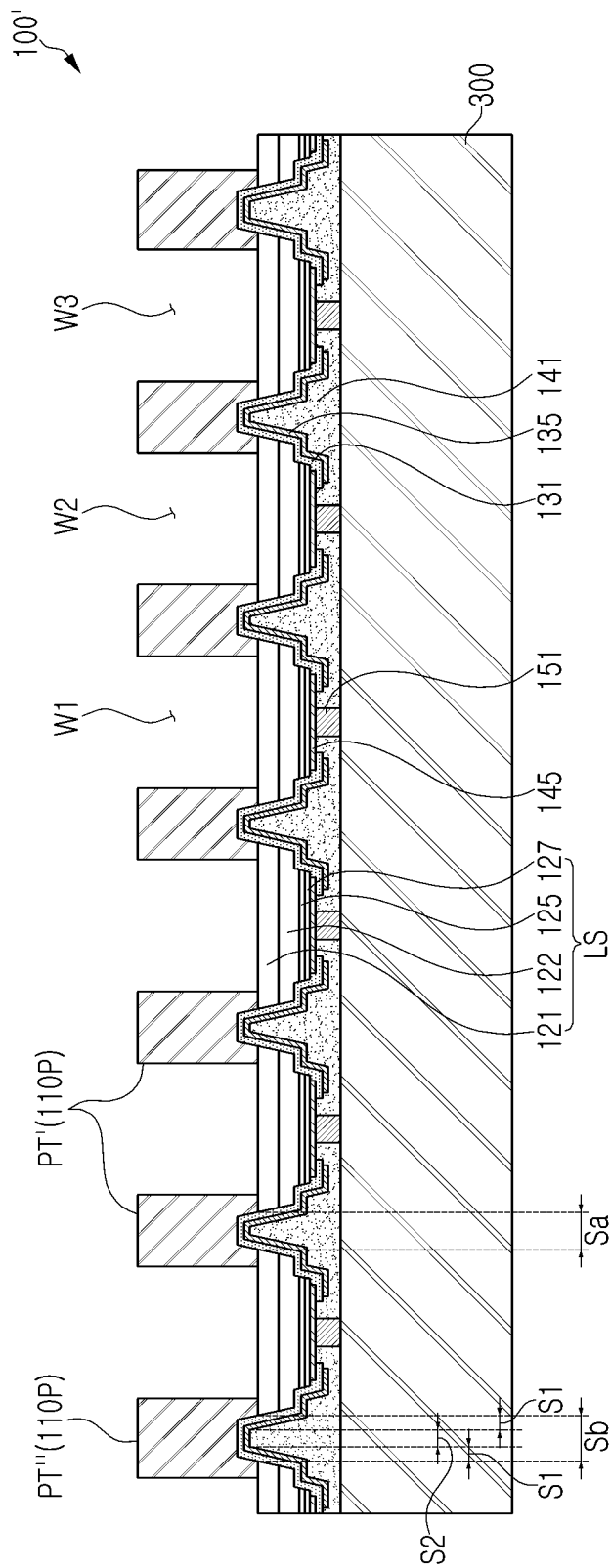
FIG. 10A is a first cross-sectional diagram illustrating main processes of a method of manufacturing a display device according to an example embodiment of the present disclosure.

Referring to FIG. 10A, a wafer 100' in which a plurality of LED cells are implemented may be disposed on a circuit substrate 300, and a partition structure 110P having first to third light emitting windows W1, W2, and W3 may be formed by processing a growth substrate 110. The partition structure 110P may be formed differently from the aforementioned example embodiment. As the partition structure 110P is cut while cutting an LED module PM in a subsequent process (see FIG. 10B), a width Sb of a portion of the partition structure 110P disposed between LED modules PM may be configured to be greater than a width Sa of a portion disposed between LED cells in the same one of the LED modules PM in consideration of a width S2 removed in the cutting process.

Figure 10B:
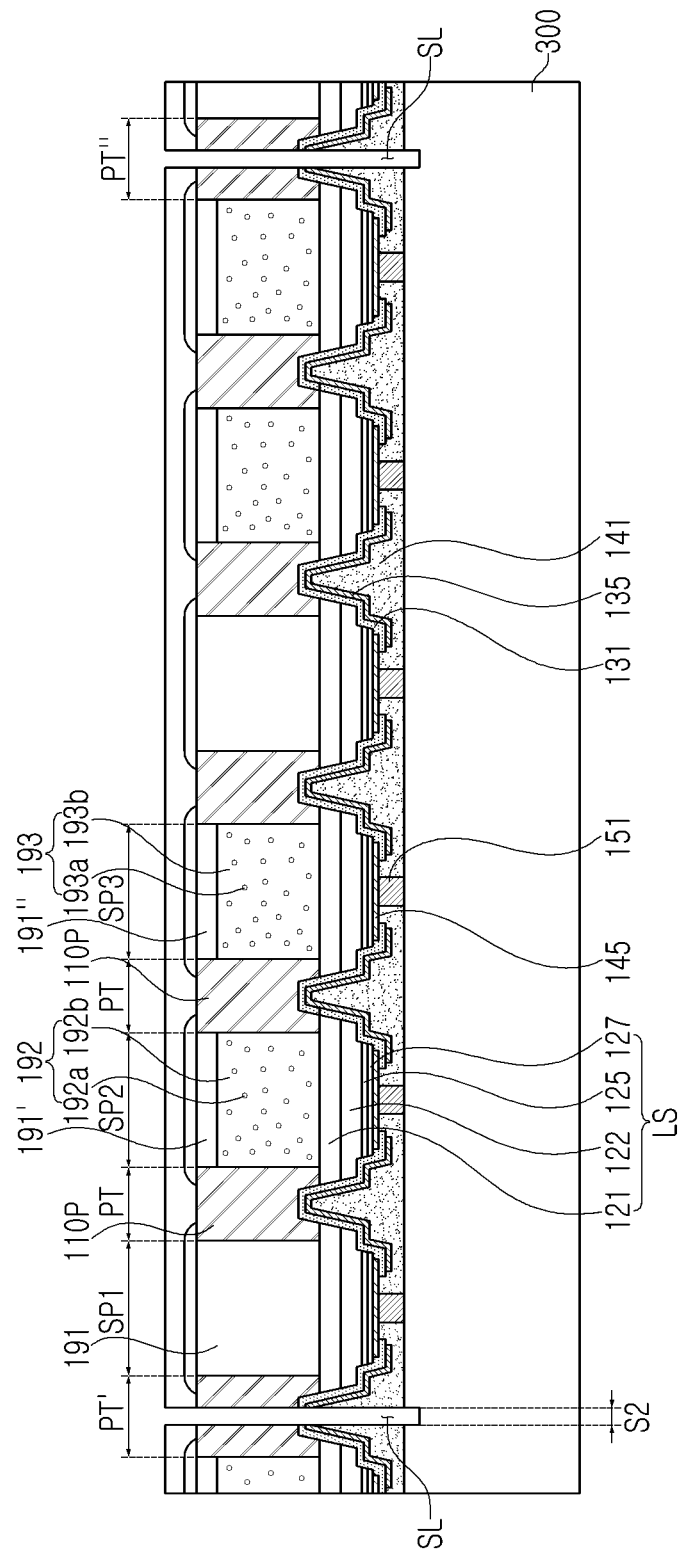
FIG. 10B is a second cross-sectional diagram illustrating main processes of the method of manufacturing the display device according to the example embodiment of the present disclosure.

Referring to FIG. 10B, a light adjusting portion may be formed in the first to third light emitting windows W1, W2, and W3, and the first to third LED cells C1, C2, and C3 may be cut while cutting an LED module PM unit to be transferred.

The process of forming the light adjustment unit may include forming first and second color conversion layers 192 and 193 in the second and third light emission windows W2 and W3, respectively, and disposing first and second transparent layers 191' and 191" on the first and second color conversion layers 192 and 193, respectively, in the second and third light emission windows W2 and W3. The process of forming the first and second transparent layers 191' and 191" may be performed together with the process of forming the transparent material layer 191. Also, first to third filter layers CF1, CF2, and CF3 (e.g., blue, green, and red color filter layers) may be disposed to cover the first to third light emitting windows W1, W2, and W3, and a transparent protective layer 195 may be additionally formed to cover the first to third color filter layers CF1, CF2, and CF3.

Thereafter, a process of cutting an LED module PM unit may be performed, and in this process, the partition structure 110P may also be cut. As described above, the area SL between the LED modules PM may be removed by a predetermined width S2 by the cutting process. After the cutting process, an edge region of the LED module PM may remain with a constant width S1.

Figure 10C:
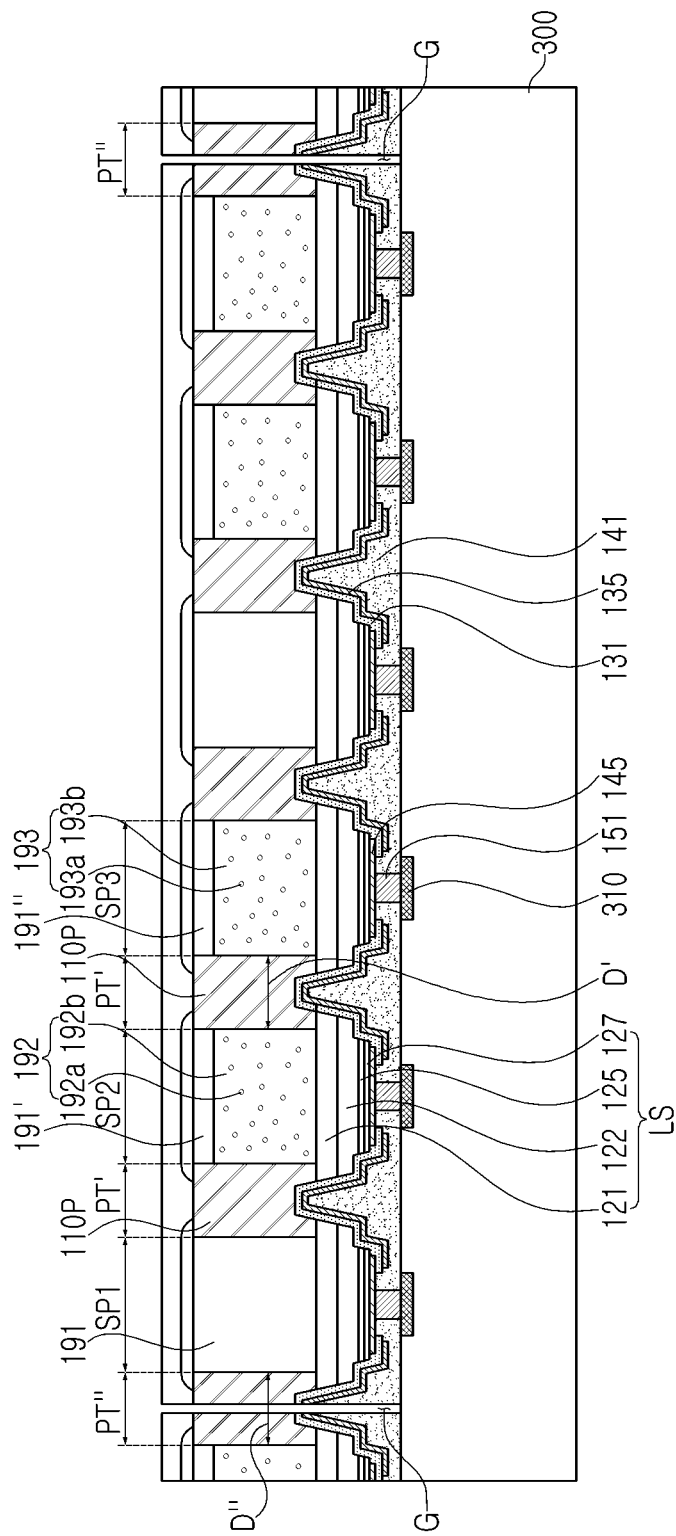
FIG. 10C is a third cross-sectional diagram illustrating main processes of the method of manufacturing the display device according to the example embodiment of the present disclosure.

Referring to FIG. 10C, the LED module PM may be transferred onto the circuit substrate 300.

After the transfer process, a process of bonding first and second electrodes 151 and 152 of the LED module PM to a pad 310 of a circuit substrate 300 so as to be connected to a driving circuit of the circuit substrate 300. Also, in the example embodiment, the LED modules PM transferred may be aligned such that the LED modules PM may have a gap G therebetween due to alignment deviation. Also, due to the gap G between the LED modules PM, a width D' of a portion of the partition structure 110P disposed between LED cells in a single LED module PM may be different from a width D" of a portion disposed between the single LED module PM and other, adjacent LED modules PM. To address the issues above, a light blocking pattern BP (in FIG. 10E) for implementing sub-pixels to have a constant gap therebetween over an entire display area may be included.

Figure 10D:
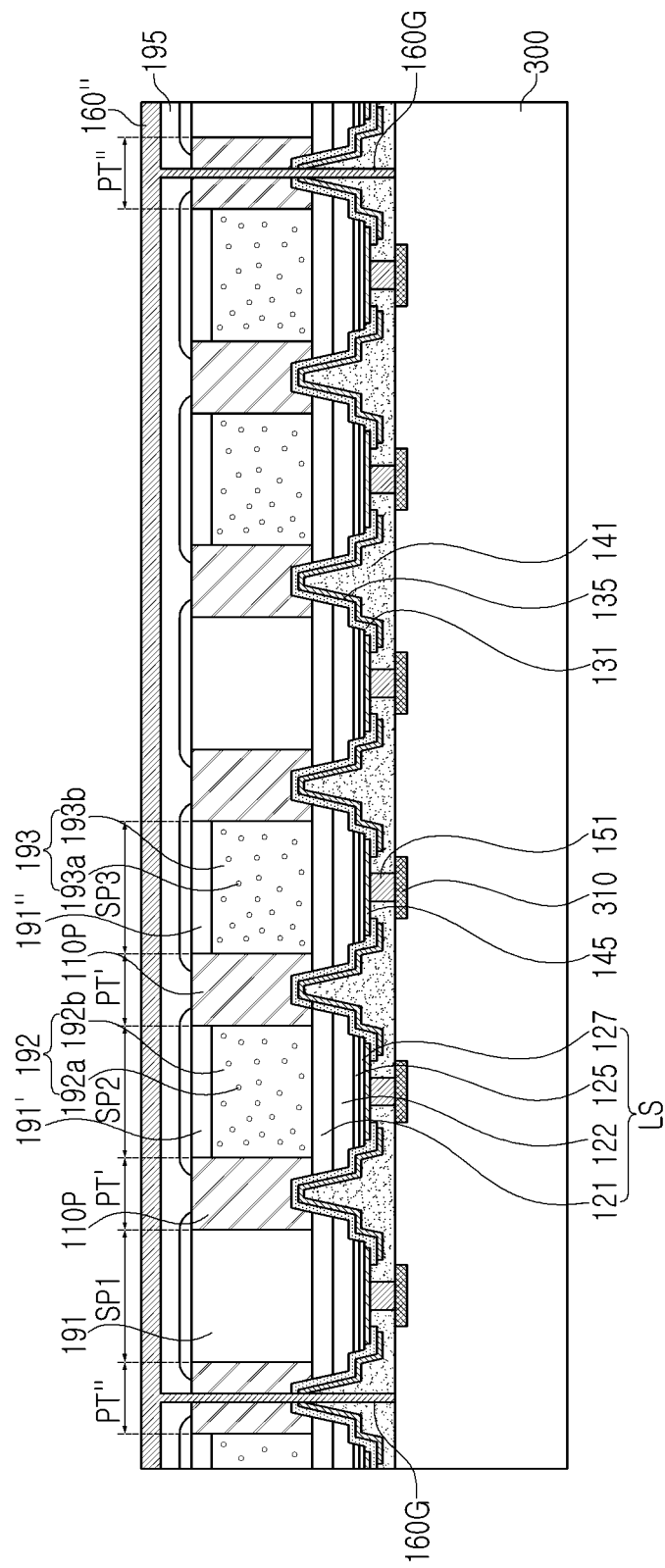
FIG. 10D is a fourth cross-sectional diagram illustrating main processes of the method of manufacturing the display device according to the example embodiment of the present disclosure.

Thereafter, referring to FIG. 10D, a material layer 160" for a light blocking pattern may be formed on the transparent protective layer 195.

In this process, the material layer 160" for the light blocking pattern may provide a gap-fill layer 160G by filling the gap G between the LED modules PM. The gap-fill layer 160G in the example embodiment may extend from the gap between the LED modules PM to the gap between partitions of the partition structure 110P. The material layer 160' for the light blocking pattern may include a light blocking material or a light reflective material. For example, the material layer 160' for the partition structure may include a black matrix or a highly reflective resin such as EMC.

Figure 10E:
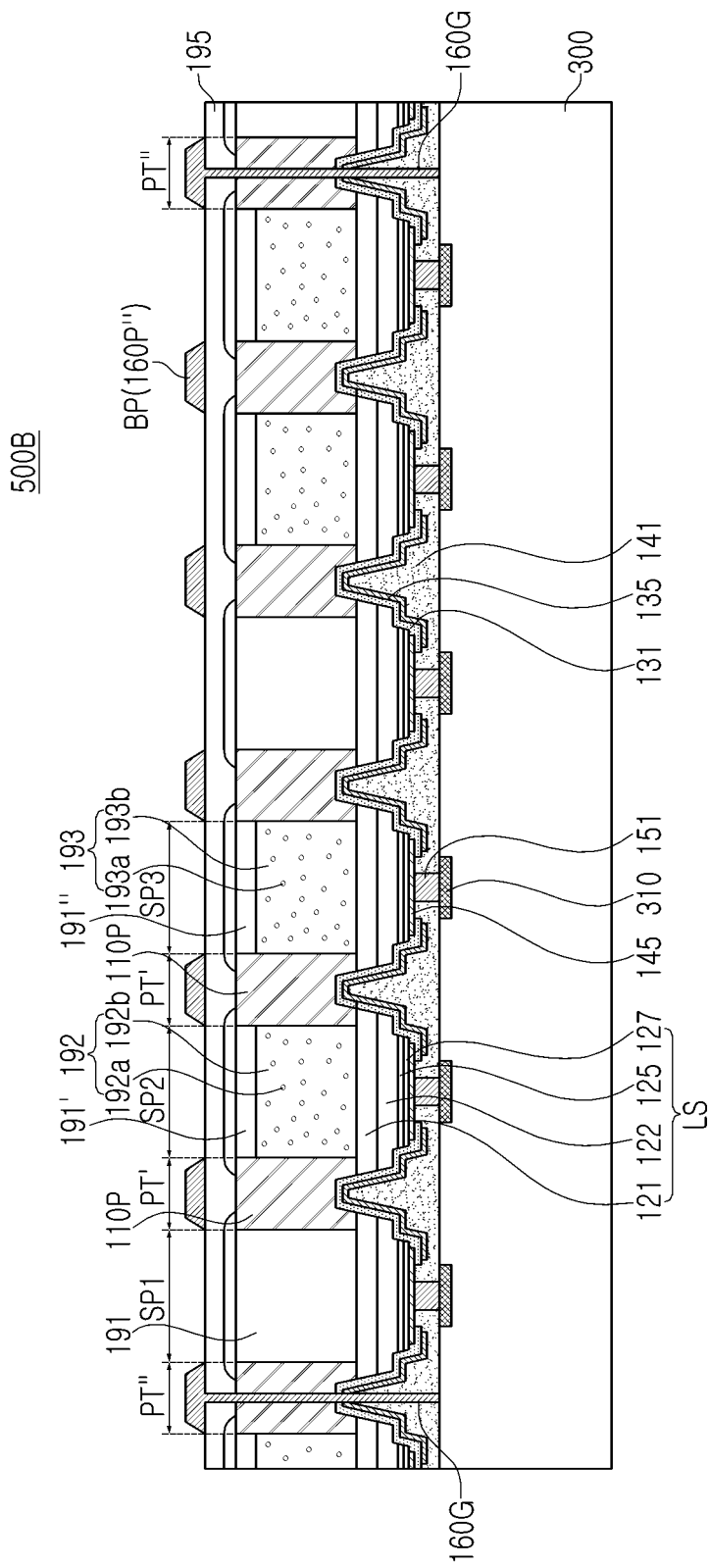
FIG. 10E is a fifth cross-sectional diagram illustrating main processes of the method of manufacturing the display device according to the example embodiment of the present disclosure.

Thereafter, referring to FIG. 10E, the material layer 160" may be processed to form a light blocking pattern BP through openings for opening the first to third light emitting windows W1, W2, and W3.

The first to third light-emitting windows W1, W2, and W3 defining sub-pixels may be formed with a desired gap (e.g., width) by the light blocking pattern BP formed in the example embodiment. In this way, the light blocking pattern BP may readjust an effective area of the light emitting windows W1, W2, and W3 and gaps among the light emitting windows W1, W2, and W3 using an area and a line width of the opening, and accordingly, alignment deviation generated in the transfer process may be compensated. In example embodiments, to efficiently perform the readjustment, a width of the light blocking pattern BP may be greater than a width of the partition structure 160P. Accordingly, a partial region of the light blocking pattern BP may be disposed to overlap a partial region of the first to third light emitting windows W1, W2, and W3.

Figure 11:
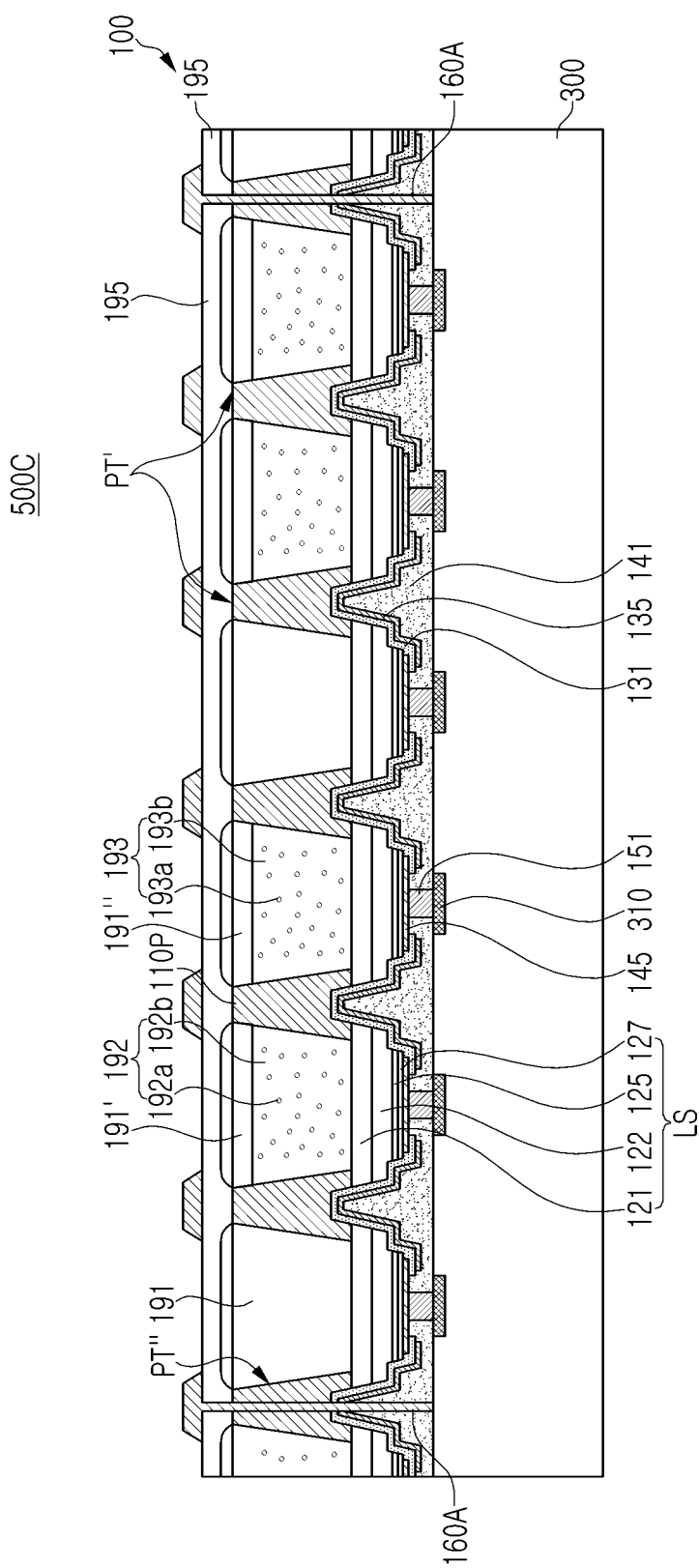
FIG. 11 is a cross-sectional diagram illustrating a portion of a display device according to an example embodiment of the present disclosure.
Figure 12:
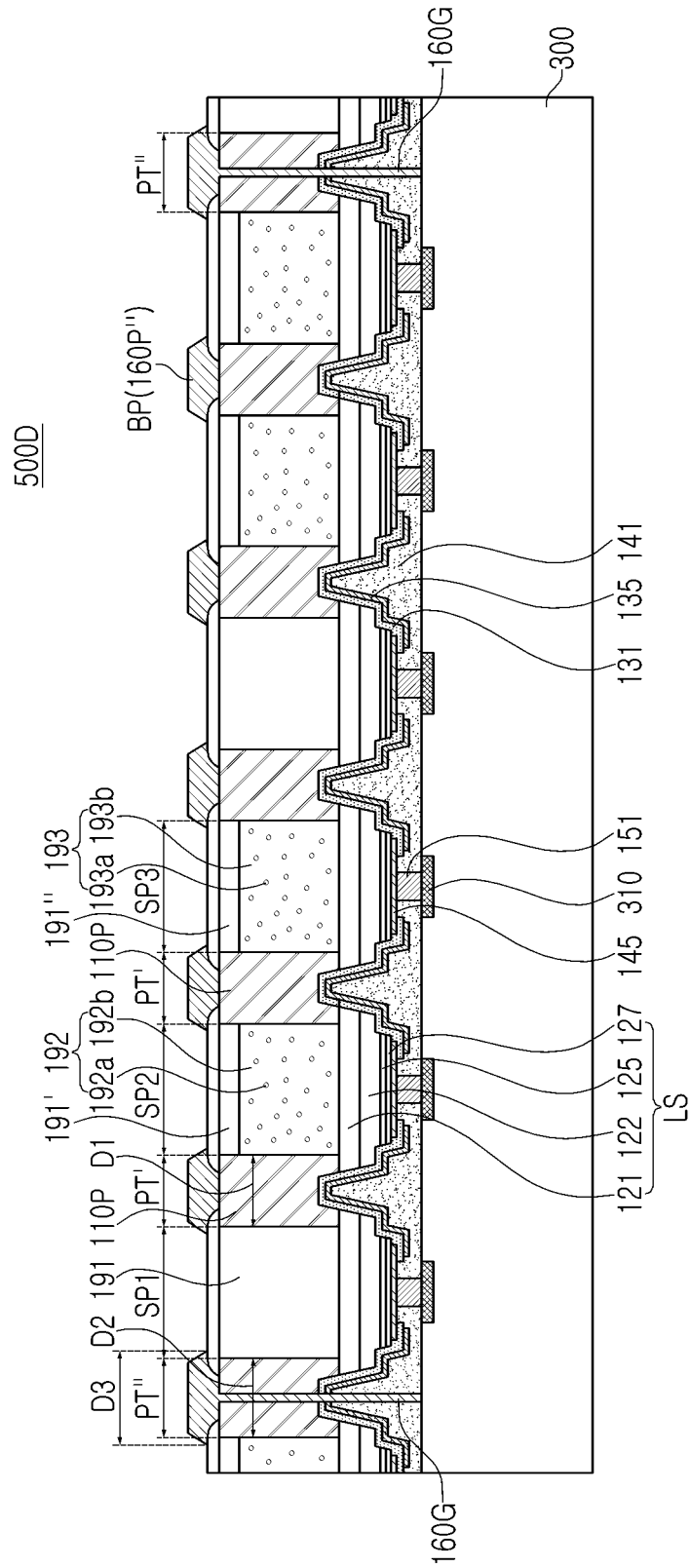
FIG. 12 is a cross-sectional diagram illustrating a portion of a display device according to an example embodiment of the present disclosure.
Figure 13:
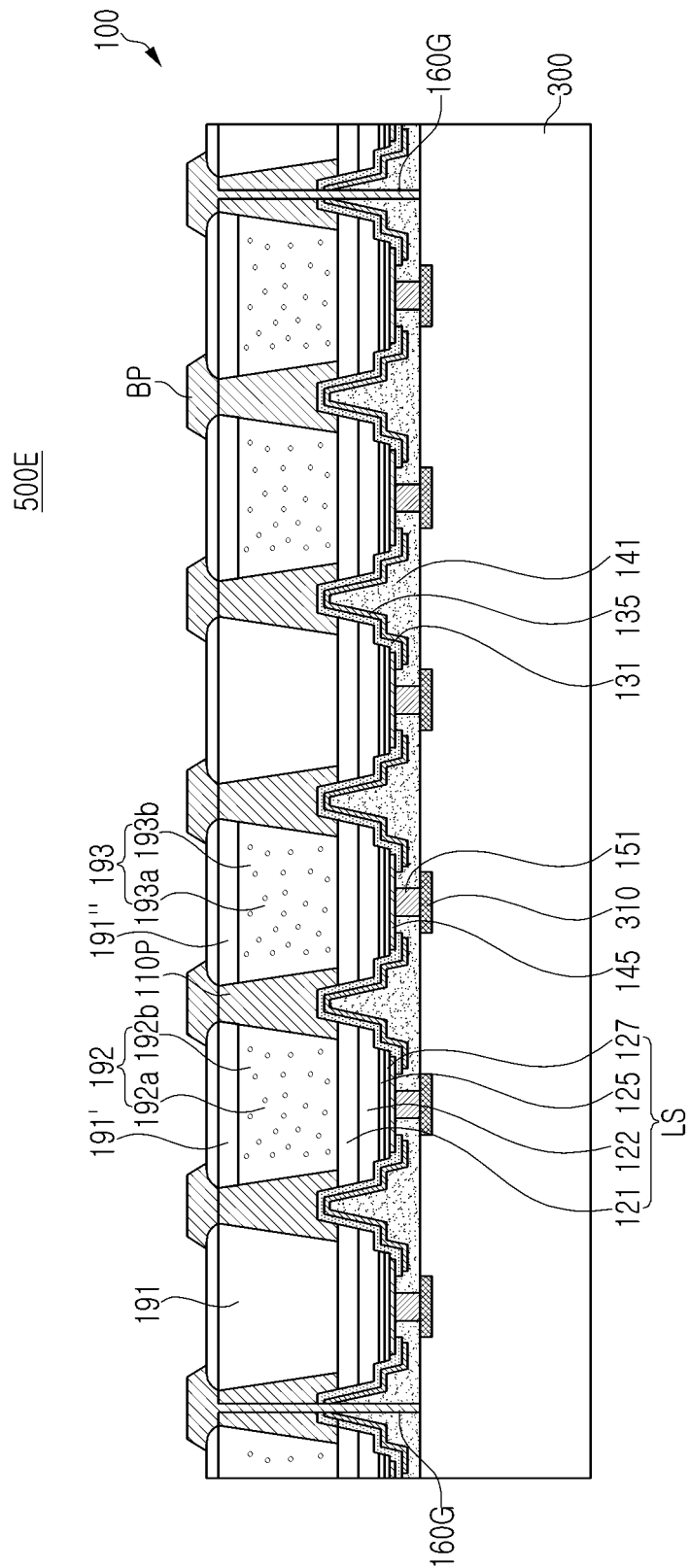
FIG. 13 is a cross-sectional diagram illustrating a portion of a display device according to an example embodiment of the present disclosure.

FIGS. 11 to 13 are cross-sectional diagrams illustrating portions of a display device according to various example embodiments.

Referring to FIG. 11, a display device 500C in the example embodiment may be similar to the display device 500B illustrated in FIG. 10E, except a configuration of a partition structure may be different. Also, the elements of the example embodiment may be understood with reference to the description of the same or similar elements of the display device 500B described in the manufacturing method illustrated in FIGS. 10A to 10E unless otherwise indicated.

In the display device 500C in the example embodiment, a partition structure PT and a light adjustment portion may be formed before a transfer process, similarly to the display device 500B illustrated in FIG. 10E, but differently from the aforementioned example embodiment, the partition structure PT may be formed using a separate material layer after the growth substrate such as silicon is removed.

The partition structure PT in the example embodiment may be formed by a method similar to the method of the process illustrated in FIGS. 9A to 9D. In other words, a light emitting window may be formed by forming a material layer for the partition structure on a surface from which the growth substrate is removed, and patterning the material layer. Thereafter, a desired light adjustment portion (first and second color conversion layers 192 and 193, and first to third color filter layers CF1, CF2, and CF3, and the like) may be formed in the light emitting windows. However, as the partition structure PT may be formed before the process of being divided with an LED module unit, a gap-fill layer 160G formed after the transfer process may be formed during the process of forming the light blocking pattern BP. Accordingly, the gap-fill layer 160G may be connected to the light blocking pattern BP and may be formed of the same material (see FIGS. 10D and 10E).

Referring to FIG. 12, the display device 500D in the example embodiment may be similar to the display device 500B illustrated in FIG. 10E, except the light blocking pattern BP may be disposed without a transparent protective layer. Also, the elements of the example embodiment may be understood with reference to the description of the same or similar elements of the display device 500B described in the manufacturing method illustrated in FIGS. 10A to 10E unless otherwise indicated.

In the aforementioned example embodiment (see FIG. 10E), as the light blocking pattern BP defining a sub-pixel is disposed on the transparent protective layer 195, when the transparent protective layer 195 has a relatively large thickness, light leakage may occur through the transparent protective layer 195 such that unwanted interference may occur between sub-pixels. To address the light leakage, in the example embodiment, the light blocking pattern BP may be disposed on the partition structure 110P without forming a transparent protective layer.

The partition structure 110P in the example embodiment may include a plurality of partition structures corresponding to the plurality of LED modules PM, respectively, similarly to the example embodiment illustrated in FIG. 10E. The gap-fill layer 160G may extend to a region between the plurality of partition structures, and the light blocking pattern BP may be connected to an extended portion of the gap-fill layer 160G. Also, the light blocking pattern BP in the example embodiment may be connected to the partition structure 110P.

Referring to FIG. 13, a display device 500E in the example embodiment may be similar to the display device 500C illustrated in FIG. 11, except the light blocking pattern BP may be disposed without a transparent protective layer. Also, the elements of the example embodiment may be understood with reference to the description of the same or similar elements of the display device 500C illustrated in FIG. 11 unless otherwise indicated.

Similarly to the example embodiment illustrated in FIG. 12, in the display device 500E in the example embodiment, the light blocking pattern BP may be formed on the partition structure 110P without forming a transparent protective layer to prevent light leakage.

The partition structure 110P in the example embodiment may include a plurality of partition structures corresponding to the plurality of LED modules PM, respectively, similarly to the example embodiment illustrated in FIG. 11. The gap-fill layer 160G may extend to a region between the plurality of partition structures, and the light blocking pattern BP may be connected to each of the extended portion of the gap-fill layer 160G and the partition structure 110P.

Figure 14:
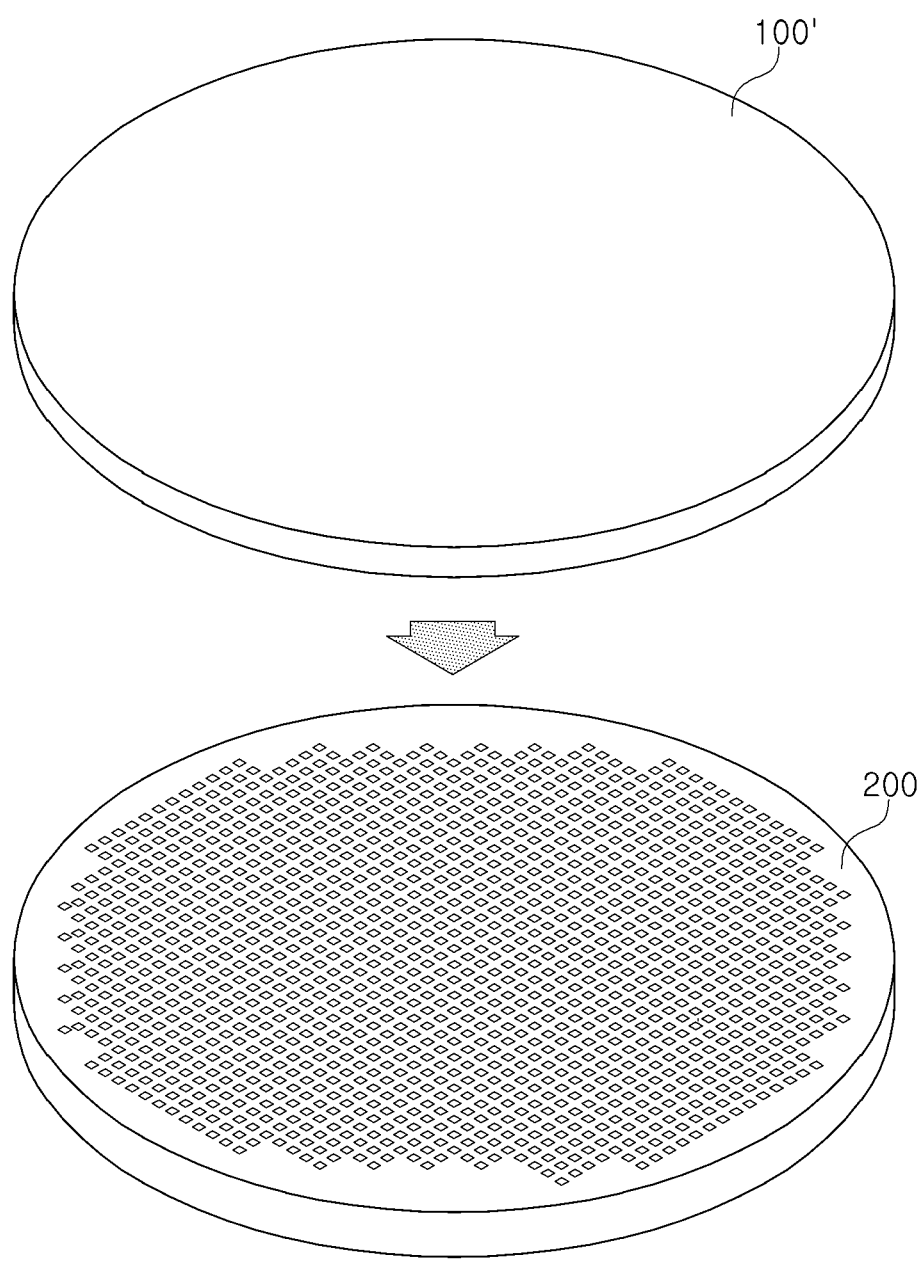
FIG. 14 is a perspective diagram illustrating a process of bonding wafers (first and second substrate structures)
Figure 15:
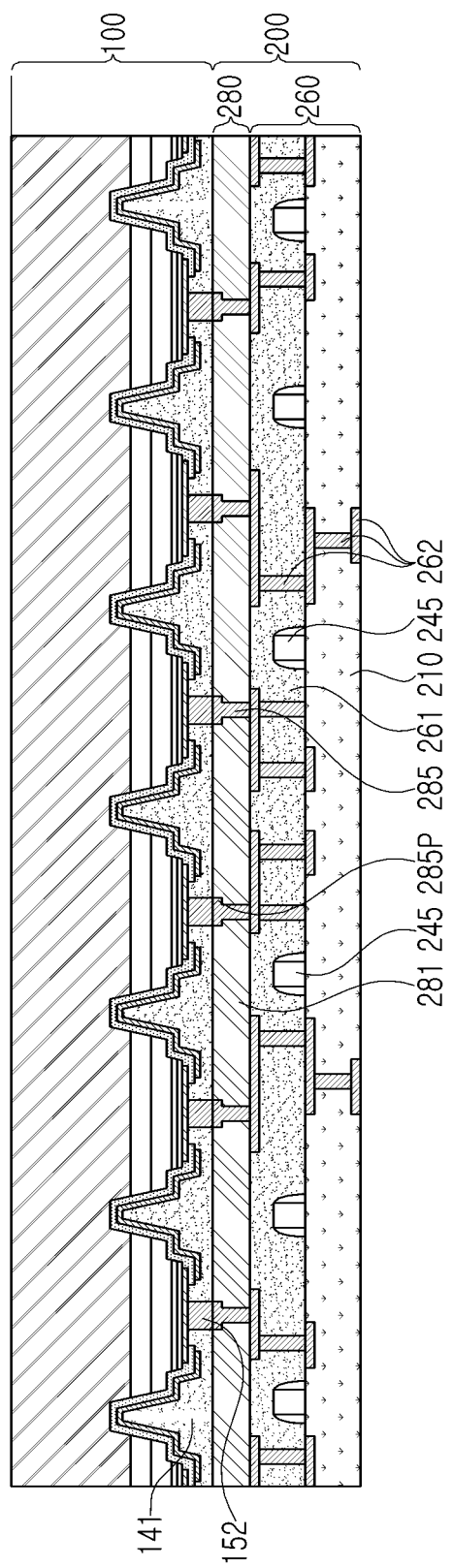
FIG. 15 is a side cross-sectional diagram illustrating the bonded wafers (an LED module) illustrated in FIG. 14.

FIG. 14 is a perspective diagram illustrating a process of bonding wafers (first and second substrate structures). FIG. 15 is a cross-sectional diagram illustrating the bonded wafers (an LED module) illustrated in FIG. 14.

Referring to FIGS. 14 and 15, the LED module PM in the example embodiment may be obtained by bonding a first substrate (e.g., wafer 100') having an LED array to a second substrate 200 (referred to as a circuit unit) in which a wiring circuit including a plurality of transistors is implemented. For example, the first substrate (wafer 100') and the second substrate 200 may be bonded to each other at a wafer level by a wafer bonding method such as a fusion bonding method or a hybrid bonding method.

The first substrate (wafer 100') in the example embodiment may be understood as the wafer 100' illustrated in FIG. 6A. Also, as illustrated in FIG. 15, the second substrate 200 may include a wiring layer 280 and a device layer 260 in which a wiring circuit including a plurality of transistor cells 245 is implemented. The wiring circuit may correspond to a partial driving circuit of the circuit substrate 300 illustrated in FIG. 6C. When the LED module PM of the example embodiment is employed, the driving circuit may be implemented to have a simplified form in the circuit substrate 300 illustrated in FIG. 6C.

The device layer 260 may include a semiconductor substrate 210, a driving circuit including a transistor (TR) cell 245 formed on the semiconductor substrate 210, an interconnection portion 262 electrically connected to the TR cell 245, and an interlayer insulating layer 261 disposed on the semiconductor substrate 210 and covering the driving circuit and the interconnection portion 262. For example, the semiconductor substrate 210 may include a semiconductor such as Si or Ge, or a compound semiconductor such as SiGe, SiC, GaAs, InAs, or InP. The wiring layer 280 may include a dielectric layer 281 disposed on the interlayer insulating layer 261 and a metal wiring 285 disposed in the dielectric layer 281 and connected to the interconnection portion 262. The metal wiring 285 may be electrically connected to the driving circuit through the interconnection portion 262. The dielectric layer 281 may have a substantially planar surface in contact with a surface of a filling insulating portion 141. The metal wiring 285 may have a bonding pad 285P exposed on the planar surface of the dielectric layer 281. In the wafer bonding process illustrated in FIG. 14, the planar surface of the dielectric layer 281 may be bonded to a planar surface of the filling insulating portion 141, and the first electrode 151 and the second electrode 152 may be bonded to a bonding pad 285P. The first and second electrodes 151 and 152 and the bonding pad 285P may include copper or a copper-containing alloy, and may be formed by, for example, a dual-damascene process.

Figure 16:
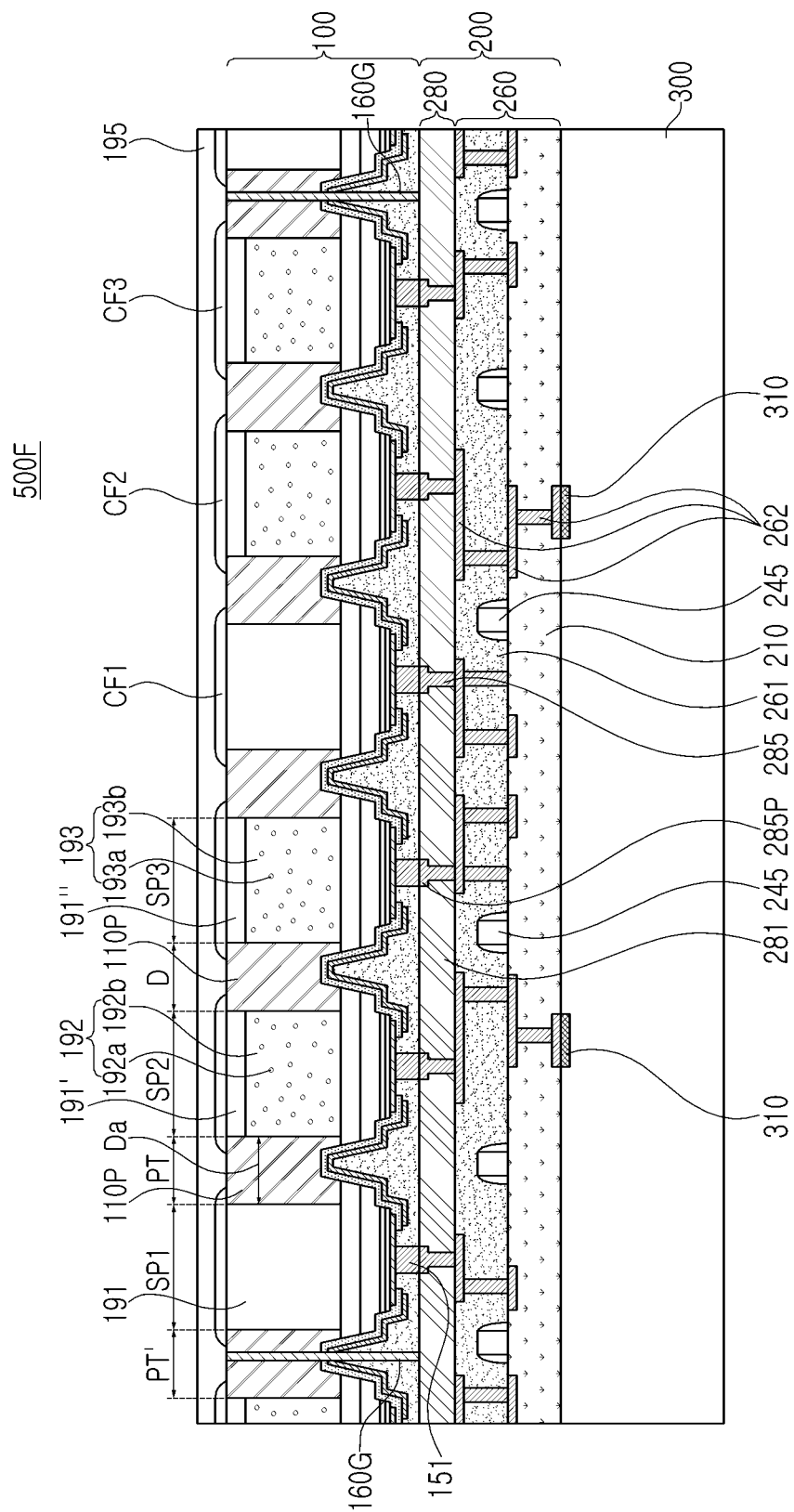
FIG. 16 is a cross-sectional diagram illustrating a portion of a display device according to an example embodiment of the present disclosure.

FIG. 16 is a cross-sectional diagram illustrating a portion of a display device according to an example embodiment.

Referring to FIG. 16, a display device 500F in the example embodiment may be similar to the display device illustrated in FIG. 5, except the LED cell array 100 may further include a circuit unit (e.g. a second substrate 200) including a portion of a transistor circuit. Also, the elements of the example embodiment may be understood with reference to the descriptions of the same or similar elements of the display device illustrated in FIG. 5 unless otherwise indicated.

The LED cell array 100 in the example embodiment may include one or more circuit units (e.g. second substrate 200) disposed between the plurality of LED modules PM and the circuit substrate 300. The circuit units (e.g. second substrate 200) may include a wiring circuit including a transistor (e.g. transistor cells 245). Also, as the plurality of circuit units are cut together with the LED module PM for the transfer process, a gap may be formed between the LED modules PM and also between the circuit units after the transfer process, and the gap-fill layer 160G for filling the gaps may extend to a gap between the plurality of circuit units.

According to the aforementioned example embodiments, by transferring the LED cell array onto a partial module (referred to as an LED module) corresponding to each divided region, the process of transferring an micro LED may be simplified.

Also, by forming the partition structure having a light emitting window after the transfer/bonding process, alignment deviation may be addressed and sub-pixels may have a constant gap (e.g., width) therebetween.

Also, even when a partition structure having a light-emitting window is formed prior to the transfer process, by forming a light-blocking pattern for defining an effective area of the light-emitting window, a gap between sub-pixels may be recognized to be constant.

While the example embodiments have been shown and described above, it will be apparent to those skilled in the art that modifications and variations could be made without departing from the scope of the present disclosure.

What is claimed is:

1. A display device, comprising:
a circuit substrate including a driving circuit;
an LED cell array disposed on the circuit substrate, and including a plurality of LED modules, each of the plurality of LED modules including at least two LED cells, from among a plurality of LED cells of the LED cell array, and an insulator coupling the at least two LED cells to each other;
a gap-fill layer filling a gap between the plurality of LED modules and not disposed between the at least two LED cells of each of the plurality of LED modules;
a partition disposed on the LED cell array, and defining a plurality of light emitting windows disposed in regions corresponding to the plurality of LED cells, respectively; and
at least one color conversion layer disposed in at least a portion of the plurality of light emitting windows,
wherein each LED cell of the plurality of LED cells includes an active layer, a first conductivity-type semiconductor layer on a first side of the active layer of the LED cell that is towards the partition, and a second conductivity-type semiconductor layer that is on a second side of the active layer of the LED cell that is towards the circuit substrate,
wherein each LED cell of the plurality of LED cells further includes a first electrode and a second electrode that are configured to connect the first conductivity-type semiconductor layer and the second conductivity-type semiconductor layer, respectively, to the driving circuit,
wherein each LED cell of the plurality of LED cells comprises a semiconductor stack that comprises the active layer, the first conductivity-type semiconductor layer, and the second conductivity-type semiconductor layer,
wherein a side portion of a top surface of the semiconductor stack is in direct contact with a bottom surface of the partition,
wherein a center portion of the top surface of the semiconductor stack is exposed from the partition such that the center portion directly faces towards a light emitting window from among the plurality of light emitting windows, without the partition being between the center portion and the light emitting window,
wherein a distance, between the plurality of light emitting windows disposed in each of the plurality of LED modules, is the same as a distance between adjacent ones of the plurality of light emitting windows that are from adjacent LED modules from among the plurality of LED modules,
wherein a first portion of the gap-fill layer disposed between the adjacent LED modules from among the plurality of LED modules has a first width that is different from a second width of a second portion of the gap-fill layer disposed between other adjacent LED modules from among the plurality of LED modules, and
wherein the first width and the second width are measured at a same vertical level of the display device.

2. The display device of claim 1, wherein a first imaginary vertical line passing through a center of a region between adjacent LED cells from among the at least two LED cells of one of the plurality of LED modules is offset, in a horizontal direction, from a second imaginary vertical line passing through a center of a portion of the partition disposed on the region between the adjacent LED cells in the one of the plurality of LED modules.

3. The display device of claim 1, wherein
the partition includes a plurality of partitions, partitions of the plurality of partitions include a same single crystal and are each provided to a respective one of the plurality of LED modules such as to define light emitting windows, from among the plurality of light emitting windows, that correspond to the at least two LED cells of the respective one of the plurality of LED modules, and
a width of an outer portion of each of the plurality of partitions is less than a width of an inner portion thereof.

4. The display device of claim 3, wherein the gap-fill layer extends to a space between the plurality of partitions.

5. The display device of claim 3, wherein the gap-fill layer includes a light blocking material or a light reflective material.

6. The display device of claim 1, wherein the partition includes a light blocking material or a light reflective material.

7. The display device of claim 6, wherein the partition includes a same material as a material of the gap-fill layer.

8. The display device of claim 6, wherein the partition is configured to have a single structure that is disposed over the plurality of LED modules.

9. The display device of claim 6, wherein the partition includes a plurality of partitions, partitions of the plurality of partitions are each provided to a respective one of the plurality of LED modules such as to define light emitting windows, from among the plurality of light emitting windows, that correspond to the at least two LED cells of the respective one of the plurality of LED modules.

10. The display device of claim 9, wherein a width of an outer portion of each of the plurality of partitions is less than a width of an inner portion thereof.

11. The display device of claim 9, wherein the gap-fill layer extends to a space between the plurality of partitions.

12. The display device of claim 1, further comprising:
a light blocking pattern disposed on the partition, and having a plurality of openings that expose the plurality of light emitting windows, respectively.

13. The display device of claim 12, wherein a width of the light blocking pattern is greater than a width of a wall of the partition that is overlapped by the light blocking pattern.

14. The display device of claim 12, wherein
the partition includes a plurality of partitions, partitions of the plurality of partitions are each provided to a respective one of the plurality of LED modules such as to define light emitting windows, from among the plurality of light emitting windows, that correspond to the at least two LED cells of the respective one of the plurality of LED modules, and
the gap-fill layer includes a portion that extends to a space between the plurality of partitions, and the light blocking pattern is connected to the portion of the gap-fill layer.

15. The display device of claim 12, wherein the light blocking pattern is connected to the partition.

16. The display device of claim 1, wherein
the LED cell array includes a plurality of circuits disposed between the plurality of LED modules and the circuit substrate,
each of the plurality of circuits includes a transistor, and
the gap-fill layer extends to a region between the plurality of circuits.

17. The display device of claim 1, wherein the gap-fill layer extends to a level below the partition.

18. A display device, comprising:
a circuit substrate;
an LED cell array disposed on the circuit substrate, and including a plurality of LED modules that each include a plurality of LED cells, where the plurality of LED cells are provided as a plurality of sub-pixels included in each of a plurality of pixels;
a plurality of partitions disposed on the plurality of LED modules, respectively, each partition from among the plurality of partitions defining a plurality of light emitting windows disposed in regions corresponding to the plurality of LED cells of a respective one of the plurality of LED modules;
a gap-fill layer filling a gap that is between the plurality of LED modules and between the plurality of partitions, the gap-fill layer not disposed between the plurality of LED cells of each of the plurality of LED modules;
at least one color conversion layer disposed in at least a portion of the plurality of light emitting windows; and
a light blocking pattern disposed on the plurality of partitions, connected to the gap-fill layer, and having a plurality of openings that expose the plurality of light emitting windows, respectively, each of the plurality of openings having a same width,
wherein each LED cell of the plurality of LED cells comprises a semiconductor stack that comprises an active layer, a first conductivity-type semiconductor layer, and a second conductivity-type semiconductor layer,
wherein a side portion of a top surface of the semiconductor stack is in direct contact with a bottom surface of one of the plurality of partitions, and
wherein a center portion of the top surface of the semiconductor stack is exposed from the one of the plurality of partitions such that the center portion directly faces towards a light emitting window from among the plurality of light emitting windows, without the one of the plurality of partitions being between the center portion and the light emitting window,
wherein a distance, between the plurality of light emitting windows disposed in each of the plurality of LED modules, is the same as a distance between adjacent ones of the plurality of light emitting windows that are from adjacent LED modules from among the plurality of LED modules,
wherein a first portion of the gap-fill layer disposed between the adjacent LED modules from among the plurality of LED modules has a first width that is different from a second width of a second portion of the gap-fill layer disposed between other adjacent LED modules from among the plurality of LED modules, and
wherein the first width and the second width are measured at a same vertical level of the display device.

* * * * *